US 9,620,702 B2

(12) United States Patent
Kohda

(10) Patent No.: US 9,620,702 B2
(45) Date of Patent: Apr. 11, 2017

(54) ELECTRONIC COMPONENT PACKAGE, ELECTRONIC COMPONENT PACKAGE SEALING MEMBER AND METHOD FOR PRODUCING THE ELECTRONIC COMPONENT PACKAGE SEALING MEMBER

(71) Applicant: DAISHINKU CORPORATION, Kakogawa-shi, Hyogo (JP)

(72) Inventor: Naoki Kohda, Kakogawa (JP)

(73) Assignee: DAISHINKU CORPORATION, Kakogawa-shi (JP)

( * ) Notice: Subject to any disclaimer, the term of this patent is extended or adjusted under 35 U.S.C. 154(b) by 374 days.

(21) Appl. No.: 14/345,484

(22) PCT Filed: Sep. 28, 2012

(86) PCT No.: PCT/JP2012/075193
§ 371 (c)(1),
(2) Date: Mar. 18, 2014

(87) PCT Pub. No.: WO2013/047807
PCT Pub. Date: Apr. 4, 2013

(65) Prior Publication Data
US 2014/0346930 A1  Nov. 27, 2014

(30) Foreign Application Priority Data
Sep. 30, 2011 (JP) .................. 2011-216965

(51) Int. Cl.
*H01L 41/053* (2006.01)
*H01L 41/23* (2013.01)
(Continued)

(52) U.S. Cl.
CPC .......... *H01L 41/0533* (2013.01); *H01L 41/23* (2013.01); *H03H 9/0519* (2013.01);
(Continued)

(58) Field of Classification Search
CPC .................. H01L 41/053; H01L 41/0533
(Continued)

(56) References Cited

U.S. PATENT DOCUMENTS 4,639,288 A    1/1987  Price et al.
6,720,661 B2   4/2004  Hanaoka et al.
(Continued)

FOREIGN PATENT DOCUMENTS

CN    102195598 A    9/2011
JP    S61-115336 A   6/1986
(Continued)

*Primary Examiner* — Derek Rosenau
(74) *Attorney, Agent, or Firm* — Marvin A. Motsenbocker; American Patent Works

(57) ABSTRACT

The present invention relates to an electronic component package, an electronic component package sealing member, and a method for producing the electronic component package sealing member. A through hole 49 is formed in a base 4 so as to pass through between both main surfaces 42 and 43 of a base material of the base 4. An inner side surface 491 of the through hole 49 includes a curved surface 495 that expands outward in a width direction of the through hole 49.

16 Claims, 19 Drawing Sheets

(51) Int. Cl.
*H03H 9/05* (2006.01)
*H03H 9/10* (2006.01)
*H03H 3/02* (2006.01)

(52) U.S. Cl.
CPC ... *H03H 9/1021* (2013.01); *H01L 2924/0002* (2013.01); *H03H 2003/022* (2013.01); *H03H 2003/026* (2013.01)

(58) Field of Classification Search
USPC .......................................... 310/340, 344, 348
See application file for complete search history.

(56) References Cited

U.S. PATENT DOCUMENTS

| | | | |
|---|---|---|---|
| 6,962,865 | B2 | 11/2005 | Hanaoka et al. |
| 7,102,219 | B2 | 9/2006 | Hanaoka et al. |
| 8,278,567 | B2 | 10/2012 | Nakamura et al. |
| 8,604,675 | B2 | 12/2013 | Umeki |
| 8,669,819 | B2 | 3/2014 | Kohda |
| 2004/0173371 | A1 | 9/2004 | Fukushima |
| 2009/0195125 | A1* | 8/2009 | Matsugi .................. H01L 23/10 310/348 |
| 2010/0102678 | A1 | 4/2010 | Saita |
| 2010/0270891 | A1* | 10/2010 | Kohda ................. H03H 9/1021 310/344 |

FOREIGN PATENT DOCUMENTS

| | | |
|---|---|---|
| JP | H04-086011 A | 3/1992 |
| JP | H06-283951 A | 10/1994 |
| JP | 2003-86723 A | 3/2003 |
| JP | 2010-124448 A | 6/2010 |
| JP | 2010-206322 A | 9/2010 |
| TW | 492120 B | 6/2002 |
| TW | 2011-17553 A | 5/2011 |
| WO | 2011-108715 A1 | 9/2011 |

* cited by examiner

ELECTRONIC COMPONENT PACKAGE, ELECTRONIC COMPONENT PACKAGE SEALING MEMBER AND METHOD FOR PRODUCING THE ELECTRONIC COMPONENT PACKAGE SEALING MEMBER

TECHNICAL FIELD

The present invention relates to an electronic component package in which a plurality of sealing members hermetically encloses an electrode of an electronic component element, an electronic component package sealing member that can be used as the sealing member of the electronic component package, and a method for producing the electronic component package sealing member.

BACKGROUND ART

The packages of electronic components (hereinafter referred to as electronic component packages) such as piezoelectric resonator devices have their inner spaces hermetically enclosed in order to prevent property degradation of the electrodes of the electronic component elements mounted in the inner spaces.

An electronic component package of this kind includes two sealing members such as a base and a lid. The base and the lid define a package in the form of a rectangular parallelepiped. In the inner space of the electronic component package, an electronic component element such as a piezoelectric resonator plate is bonded to and held by the base. The bonding of the base and the lid hermetically encloses the electrodes of the electronic component element in the inner space of the electronic component package.

For example, Patent Document 1 discloses a crystal component (an electronic component of the present invention) that includes an electronic component package defined by the base and the lid. In the inner space of the electronic component package, a crystal plate is hermetically enclosed. The crystal component includes a base that has through holes passing through a base material of the base. Each through hole includes, on its inner side surface, a wiring metal made of a multiple-layer metal film such as Cr—Ni—Au. Each through hole further includes an alloy such as AuGe welded therein, thus securing air tightness of the inner space of the electronic component package.

PRIOR ART REFERENCE

Patent Document

[Patent Document 1] JP H06-283951 A

SUMMARY OF THE INVENTION

Problems to be Solved by the Invention

In the above Patent Document 1, the through hole is formed on the base so as to pass through between both main surfaces. An inner side surface of the through hole is inclined relative to one main surface and the other main surface of the base, and the entire inner side surface is tapered. For this reason, in the through hole, a diameter of the other open end of the through hole at the side of the other main surface of the base is maximum, and a diameter of one open end of the through hole at the side of the one main surface of the base is minimum. Or, the diameter of the one open end of the through hole at the side of the one main surface of the base is maximum, and the diameter of the other open end of the through hole at the side of the other main surface of the base is minimum.

These days, downsizing of the electronic component package has been developed. In this kind of situation, in the through hole described in Patent Document 1, whose inner side surface is entirely tapered, an open end (one open end or the other open end) formed on one of both main surfaces (one main surface or the other main surface) of the base is larger than an open end (the other open end or one open end) formed on the other of both main surfaces (the other main surface or one main surface). Therefore, an exclusive area occupied by the open end of the through hole formed on one of both main surfaces of the base is large relative to the one of both main surfaces. Thus, it is difficult to design an electrode pattern including indispensable terminals on the one of both main surfaces.

In order to resolve the above problem, the object of the present invention is to provide an electronic component package sealing member that have a relative small exclusive area occupied by the open end on the main surface of the electronic component package sealing member, and an electronic component package. It is also an object of the present invention to provide a method for producing the electronic component package sealing member.

Means for Solving Problem

To achieve the above-described object, an electronic component package sealing member according to the present invention, which can be used as a sealing member of an electronic component package in which a plurality of the sealing members hermetically encloses an electrode of an electronic component element, includes a through hole passing through between both main surfaces of a base material that constitutes the electronic component package sealing member. An inner side surface of the through hole includes a curved surface that expands outward in a width direction of the through hole.

With the present invention, the inner side surface of the through hole includes the curved surface that expands outward in the width direction of the through hole. Thus, the through hole can be formed even if each width of both open ends of the through hole is made narrow, in contrast to the through hole in which the inner side surface is entirely tapered as described in the above conventional art. In the result, the exclusive areas occupied by the open ends can be made small on both main surfaces of the electronic component package sealing member by making the open ends of the through hole be small. Also, with the present invention, since the inner side surface of the through hole includes the curved surface, the anchor effect can be exerted with respect to a material filled in the through hole. Particularly, the anchor effect by the curved surface is more effective than the anchor effect by the flat surface.

Also, to achieve the above-described object, an electronic component package sealing member according to the present invention, which can be used as a sealing member of an electronic component package in which a plurality of the sealing members hermetically encloses an electrode of an electronic component element, includes a through hole passing through between both main surfaces of a base material that constitutes the electronic component package sealing member. An inner side surface of the through hole includes a curved surface constituted by a set of points radially spreading from a plurality of predetermined reference points in the through hole, and the plurality of reference points are disposed on one surface.

With the present invention, the inner side surface of the through hole includes the curved surface constituted by the set of points radially spreading from the plurality of predetermined reference points in the through hole, and the plurality of reference points are disposed on one surface. Thus, the through hole can be formed even if each width of both open ends of the through hole is made narrow, in contrast to the through hole in which the inner side surface is entirely tapered as described in the above conventional art. In the result, the exclusive areas occupied by the open ends can be made small on both main surfaces of the electronic component package sealing member by making the open ends of the through hole be small. Also, with the present invention, since the inner side surface of the through hole includes the curved surface, the anchor effect can be exerted with respect to the material filled in the through hole. Particularly, the anchor effect by the curved surface is more effective than the anchor effect by the flat surface.

In the above configuration, a plurality of projections may be formed on the inner side surface of the through hole so as to project into the through hole, and a projection end edge of the projection may be an end edge of the curved surface.

In this case, the plurality of projections is formed on the inner side surface of the through hole, and the projection end edge of the projection is an end edge of the curved surface. Thus, by the projection end edge and the curved surface, the anchor effect can be effectively exerted with respect to the material filled in the through hole.

In the above configuration, the inner side surface of the through hole between the plurality of projections may be constituted by the curved surface.

In this case, the curved surface is formed between the plurality of projections. Thus, by the plurality of projections and the curved surface, the anchor effect can be exerted with respect to the perpendicular directions (both directions) that are perpendicular to both main surfaces of the base material.

In the above configuration, the inner side surface of the through hole may be constituted by the curved surface only.

In this case, the inner side surface of the through hole is constituted by only the curved surface. Thus, it is possible not only that the exclusive areas occupied by the open ends on both main surfaces of the electronic component package sealing member are made small, but also that the curved surface prevents the material filled in the through hole from overflowing from both main surfaces of the base material.

In the above configuration, the inner side surface of the through hole may include a tapered flat surface. The curved surface may be formed continuously from one main surface of the base material. The tapered flat surface may be formed continuously from the other main surface of the base material, and the curved surface may be formed continuously from the flat surface.

In this case, the curved surface is formed continuously from the one main surface of the base material. The tapered flat surface is formed continuously from the other main surface of the base material. The curved surface is formed continuously from the flat surface. Thus, it is possible not only that the exclusive areas occupied by the open ends on both main surfaces of the electronic component package sealing member are made small, but also that the curved surface prevents the material filled in the through hole from overflowing from the one main surface of the base material. Furthermore, the tapered flat surface is formed continuously from the other main surface of the base material, thus a filling material can be easily filled in the through hole by filling the filling material from the flat surface into the through hole.

In the above configuration, the inner side surface of the through hole may include a tapered first flat surface and a tapered second flat surface. The tapered first flat surface may be formed continuously from one main surface of the base material. The curved surface may be formed continuously from the first flat surface. The tapered second flat surface may be formed continuously from the other main surface of the base material. The curved surface may be formed continuously from the second flat surface.

In this case, the first flat surface is formed continuously from the one main surface of the base material. The curved surface is formed continuously from the first flat surface. The tapered second flat surface is formed continuously from the other main surface of the base material. The curved surface is formed continuously from the second flat surface. Thus, it is possible not only that the exclusive areas occupied by the open ends on both main surfaces of the electronic component package sealing member are made small, but also that the filling material is easily filled in the through hole from either the first flat surface or the second flat surface.

In the above configuration, a plurality of the curved surfaces may be formed.

In this case, each width of both open ends of the through hole can be made narrow.

Also, to achieve the above-described object, in an electronic component package according to the present invention, in which a plurality of sealing members hermetically encloses an electrode of an electronic component element, at least one of the sealing members is the electronic component package sealing member of the present invention.

With the present invention, at least one of the sealing members is the electronic component package sealing member of the present invention. Thus, advantageous effects of the above electronic component package sealing member of the present invention can be obtained.

Also, to achieve the above-described object, in a method of the present invention for producing an electronic component package sealing member that can be used as a sealing member of an electronic component package in which a plurality of the sealing members hermetically encloses an electrode of an electronic component element, a forming process is included, the forming process forming a through hole passing through between main surfaces of a base material that constitutes the electronic component package sealing member. The forming process includes a first forming step forming a flat surface as part of an inner side surface of the through hole and a second forming step forming a curved surface as part of the inner side surface of the through hole after completion of the first forming step. In the first forming step, the base material is wet etched to form a recess portion that has a tapered inner side surface. In the second forming step, a bottom surface of the recess portion is subject to wet-etching to form the curved surface. At least part of the inner side surface of the recess portion that is formed in the first forming step is the inner side surface of the through hole.

The present invention has the forming process including the first forming step and the second forming step. In the first forming step, the base material is wet etched to form a recess portion that has a tapered inner side surface. In the second forming step, the bottom surface of the recess portion is subject to wet-etching to form the curved surface. At least part of the inner side surface of the recess portion that is formed in the first forming step is the inner side surface of the through hole. Thus, the through hole can be formed even if each width of both open ends of the through hole is made narrow, in contrast to the through hole in which the inner side surface is entirely tapered as described in the above conventional art. In the result, the exclusive areas occupied by the open ends can be made small on both main surfaces of the electronic component package sealing member by making the open ends of the through hole be small.

Also, to achieve the above-described object, in a method of the present invention for producing an electronic component package sealing member that can be used as a sealing member of an electronic component package in which a plurality of the sealing members hermetically encloses an electrode of an electronic component element, a forming process is included, the forming process forming a through hole passing through between main surfaces of a base material that constitutes the electronic component package sealing member. The forming process includes a third forming step forming a curved surface as an inner side surface of the through hole. In the third forming step, the base material is wet etched to form a recess portion having a bottom surface. The bottom surface of the recess portion is subject to wet-etching to form the curved surface.

The present invention has the forming process including the third forming step. In the third forming step, the base material is wet etched to form the recess portion having the bottom surface. The bottom surface of the recess portion is subject to wet-etching to form the curved surface. Thus, the through hole can be formed even if each width of both open ends of the through hole is made narrow, in contrast to the through hole in which the inner side surface is entirely tapered as described in the above conventional art. In the result, the exclusive areas occupied by the open ends can be made small on both main surfaces of the electronic component package sealing member by making the open ends of the through hole be small.

In the second forming step or the third forming step of the above method, a resist layer may be formed on the base material by electrodeposition coating, and etching may be performed using the resist layer.

In this case, the resist layer is formed on the base material by electrodeposition coating, the resist layer can be formed on the inner side surface and the inner bottom surface of the recess portion.

Effects of the Invention

With the present invention, the exclusive areas occupied by the open ends can be made small on both main surfaces of the electronic component package sealing member by making the open ends of the through hole be small.

MODES FOR CARRYING OUT THE INVENTION

Hereinafter, specific embodiments of the present invention will be described with reference to the accompanying drawings. In the following embodiments, the present invention is applied to a package of a crystal resonator, which is a piezoelectric resonator device, as an electronic component package. The present invention is also applied to a tuning-fork crystal resonator plate, which is a piezoelectric resonator plate, as an electronic component element.

Figure 1:
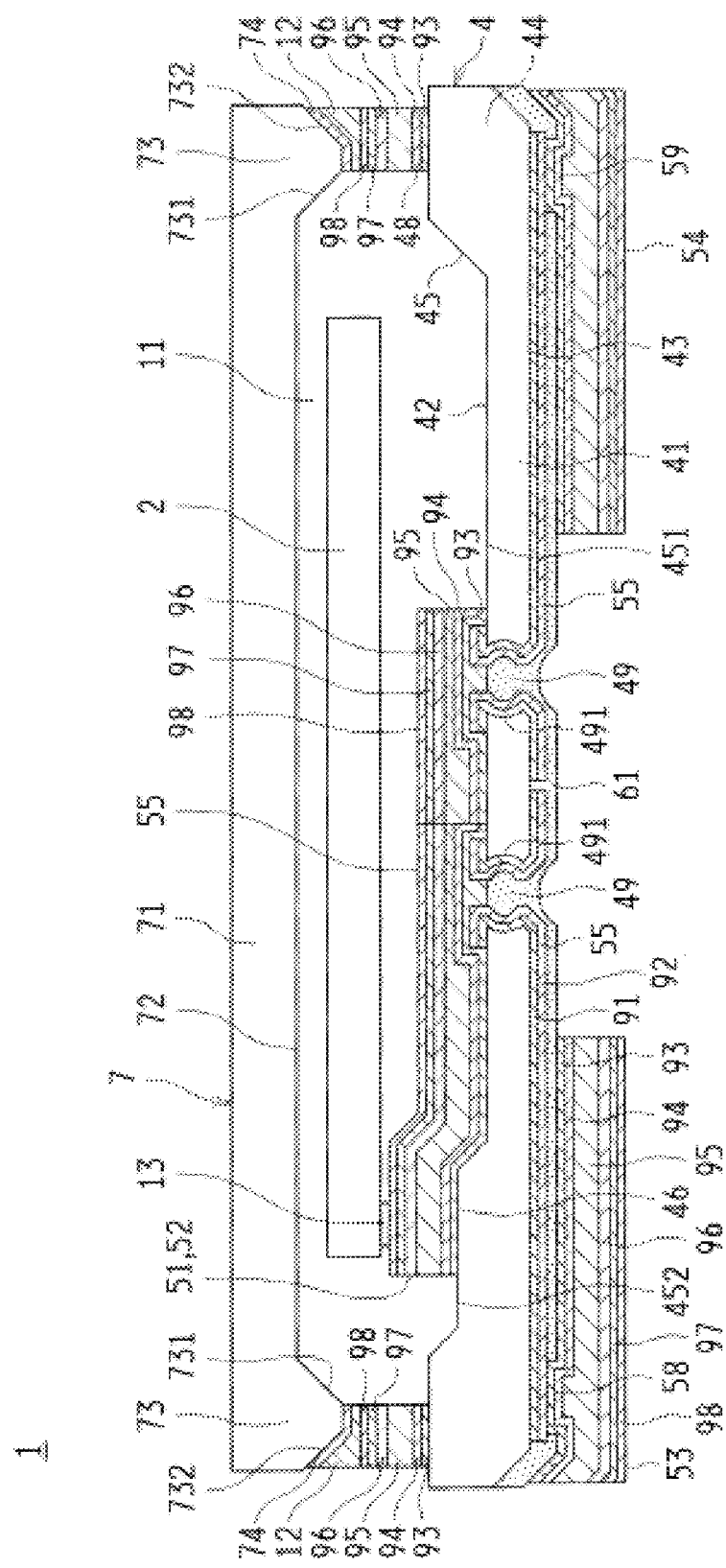
FIG. 1 is a schematic cross-sectional view of a crystal resonator according to an embodiment of the present invention taken along the line A-A of a base shown in FIG. 3, for schematically illustrating an inner space of the crystal resonator.
Figure 7:
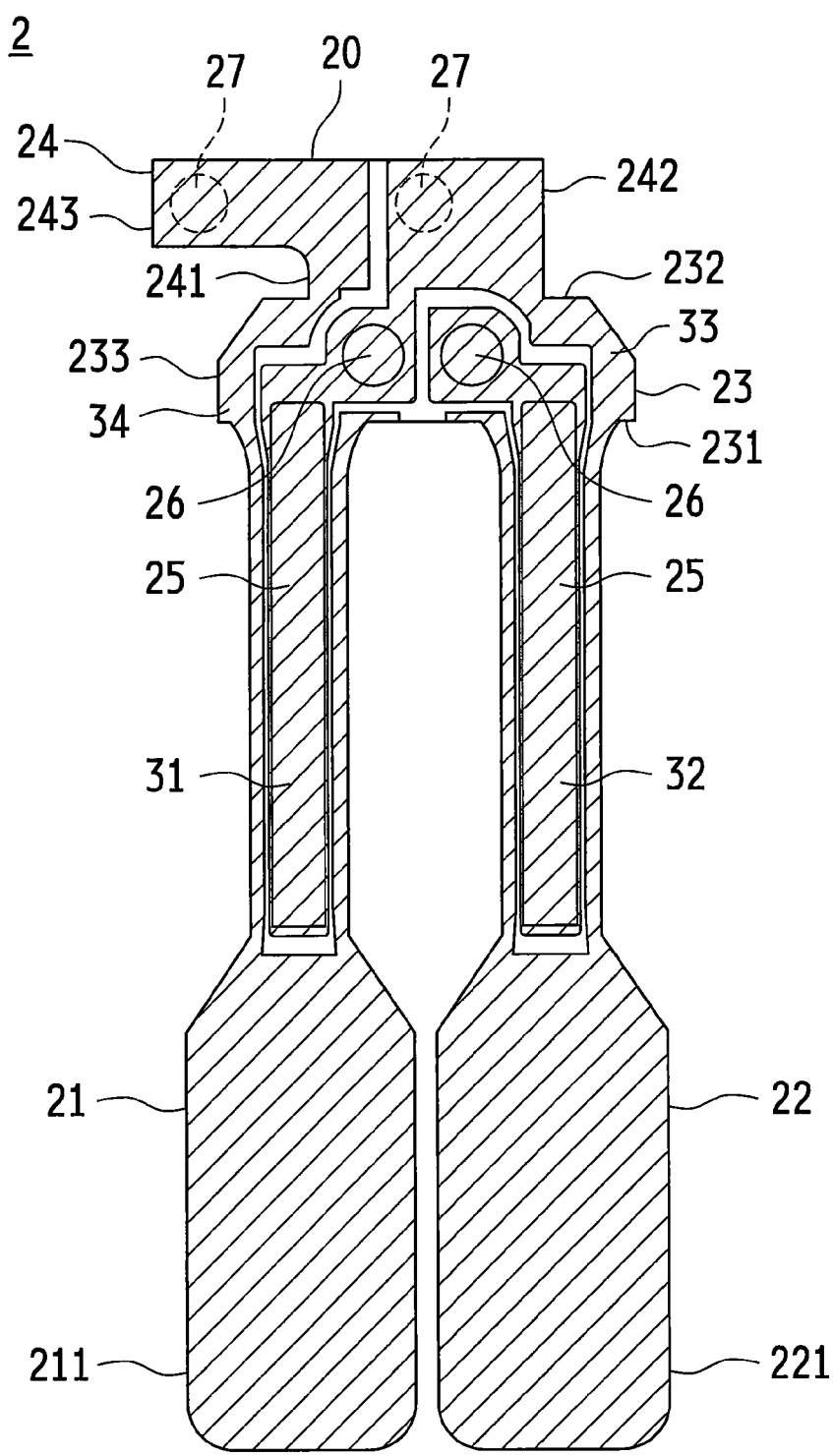
FIG. 7 is a schematic plan view of a crystal resonator plate according to the embodiment of the present invention.

As shown in FIG. 1, the crystal resonator 1 according to this embodiment of the present invention includes a crystal resonator plate 2 (an electronic component element of the present invention) shown in FIG. 7, a base 4 (a sealing member for an electronic component package as a sealing member of the present invention), and a lid 7. The crystal resonator plate 2 is made of a tuning-fork crystal resonator plate. The base 4 holds and hermetically encloses the crystal resonator plate 2. The lid 7 is disposed opposite the base 4 and hermetically encloses excitation electrodes 31 and 32 (electrodes shown in FIG. 1 and electrodes of the electronic component element of the present invention) of the crystal resonator plate 2 held on the base 4.

The crystal resonator 1 includes the base 4 and the lid 7. The base 4 and the lid 7 are bonded to each other with a bonding material 12 made of a Au—Sn alloy, a first bonding layer 48 described below, and a second bonding layer 74 described below. The bonding results in a main casing defining a hermetically enclosed inner space 11. In the inner space 11, the crystal resonator plate 2 is electrically and mechanically bonded to the base 4 by ultrasonic bonding of Flip Chip Bonding (FCB) with a conductive bump 13 such as gold bump. In this embodiment, the conductive bump 13 used is a plated bump made of a non-liquid member such as a gold bump.

Next, the constituents of the crystal resonator 1 will be described below.

The base 4 is formed by a base material made of a glass material such as borosilicate glass that is an isotropic material. As shown in FIGS. 1 to 4, the base 4 is in the form of a box including a bottom portion 41 and a wall portion 44 that extends upward from the bottom portion 41 along an outer periphery of one main surface 42 of the base 4. To form the base 4 into this box shape, a base material of a rectangular parallelepiped single plate is wet etched.

An inner side surface of the wall portion 44 of the base 4 has a tapered shape. The wall portion 44 has a top surface serving as a bonding surface for the lid 7, and the bonding surface has a first bonding layer 48 for bonding with the lid 7. The first bonding layer 48 has a multiple-layer structure that includes: a first sputtered film 93 formed on the top surface of the wall portion 44 of the base 4 by sputtering; a second sputtered film 94 sputtered on the first sputtered film 93; a first plated film 95 plated on the second sputtered film 94; a second plated film 96 plated on the first plated film 95; a third plated film 97 plated on the second plated film 96; and a fourth plated film 98 plated on the third plated film 97.

The first sputtered film 93 is a Mo film made of Mo that is formed on the top surface of the wall portion 44 of the base 4 by sputtering. The first sputtered film 93 has a thickness of 5-10 nm. The second sputtered film 94 is a Cu film made of Cu that is formed on the first sputtered film 93 by sputtering. The second sputtered film 94 has a thickness of 0.3 μm. The first plated film 95 is a Cu film made of Cu that is plated on the second sputtered film 94. The first plated film 95 has a thickness of 2-6 μm. The second plated film 96 is a Ni film made of Ni that is plated on the first plated film 95. The second plated film 96 has a thickness of 1-3 μm. The third plated film 97 is a Au strike plated film made of Au or a Pd plated film made of Pd that is plated on the second plated film 96. The third plated film 97 has a thickness of 0.1-0.3 µm. The fourth plated film 98 is a Au plated film made of Au that is plated on the third plated film 97. The fourth plated film 98 has a thickness of 0.1-0.3 µm.

The base 4 includes, on its one main surface 42, a cavity 45 having a rectangular shape in plan view surrounded by the bottom portion 41 and the wall portion 44. The cavity 45 includes, on its bottom surface 451, a pedestal portion 46 etched over an entire one end portion 452 in a longer side direction. The crystal resonator plate 2 is mounted on the pedestal portion 46. The wall surface of the cavity 45 is the inner side surface of the wall portion 44 and tapered as described above.

The base 4 includes a pair of electrode pads 51 and 52, external terminal electrodes 53 and 54, and a wiring pattern 55. The electrode pads 51 and 52 are electrically and mechanically connected to the excitation electrodes 31 and 32, respectively, of the crystal resonator plate 2. The external terminal electrodes 53 and 54 are electrically connected to an external part or an external device. The wiring pattern 55 electrically connects the electrode pad 51 to the external terminal electrode 54, and electrically connects the electrode pad 52 to the external terminal electrode 53. The electrode pads 51 and 52, the external terminal electrodes 53 and 54, and the wiring pattern 55 constitute an electrode 5 of the base 4. The electrode pads 51 and 52 are disposed on the surface of the pedestal portion 46. The two external terminal electrodes 53 and 54 are disposed on both end portions of the other main surface 43 of the base 4 and separated from one another in the longer side direction. The external terminal electrode 54 includes a cut-out portion 541 at one corner portion (one of the corner portions at the side facing the external terminal electrode 53). The cut-out portion 541 serves supporting functions such as positioning of the base in the production process of the crystal resonator 1 and positioning of the crystal resonator 1 when mounted on an external part or an external device.

The electrode pads 51 and 52 have, similarly to the first bonding layer 48, a multiple-layer structure. That is, the electrode pads 51 and 52 are formed, on the substrate of the base 4, by layering the first sputtered film 93, the second sputtered film 94, the first plated film 95, the second plated film 96, the third plated film 97, and the fourth plated film 98 in this order.

The wiring pattern 55 extends from the one main surface 42 of the base 4 to the other main surface 43 of the base 4 via inner side surfaces 491 of through holes 49 (see below) so as to electrically connect the electrode pads 51 and 52 to the external terminal electrodes 53 and 54.

At a portion of the wiring pattern 55 disposed on the through holes 49 and their vicinities, and at a portion of that disposed on the other main surface 43 of the substrate, the first seed film 91 and the second seed film 92 are formed, as lower layer films, under the first sputtered film 93. The first seed film 91 is a Mo film made of Mo that is formed on the base 4 by sputtering. The first seed film 91 has a thickness of 5-10 nm. The second seed film 92 is a Cu film made of Cu that is formed on the first seed film 91 by sputtering. The second seed film 92 has a thickness of 0.3 µm.

Also, on the one main surface 42 of the base 4, the wiring pattern 55 includes, on the second seed film 92 and on the substrate: the first sputtered film 93; the second sputtered film 94; the first plated film 95; the second plated film 96; the third plated film 97; and the fourth plated film 98, which are layered in this order.

On the other hand, in the other main surface 43 of the base 4, a resin pattern 61 (see below) made of a resin material having photosensitivity is formed on the second seed film 92, the through holes 49 and the substrate. That is, the entire surface of the other main surface 43 of the base 4 except some parts (contact areas 58 and 59) has the resin pattern 61. The parts (contact areas 58 and 59) of the other main surface 43 that do not have the resin pattern 61 have the wiring pattern 55 (second seed film 92), as shown in FIG. 1. And, on the resin pattern 61 of the other main surface 43 of the base 4 and on the second seed film 92 of the contact areas 58 and 59, the first sputtered film 93, the second sputtered film 94, the first plated film 95, the second plated film 96, the third plated film 97 and the fourth plated film 98 are layered in this order so as to configure the external terminal electrodes 53 and 54.

As shown in FIGS. 1 to 4, the base 4 includes the through holes 49 through which the excitation electrodes 31 and 32 of the crystal resonator plate 2 are led out from inside the cavity 45 to outside the cavity 45 by the wiring pattern 55 via the electrode pads 51 and 52.

Figure 4:
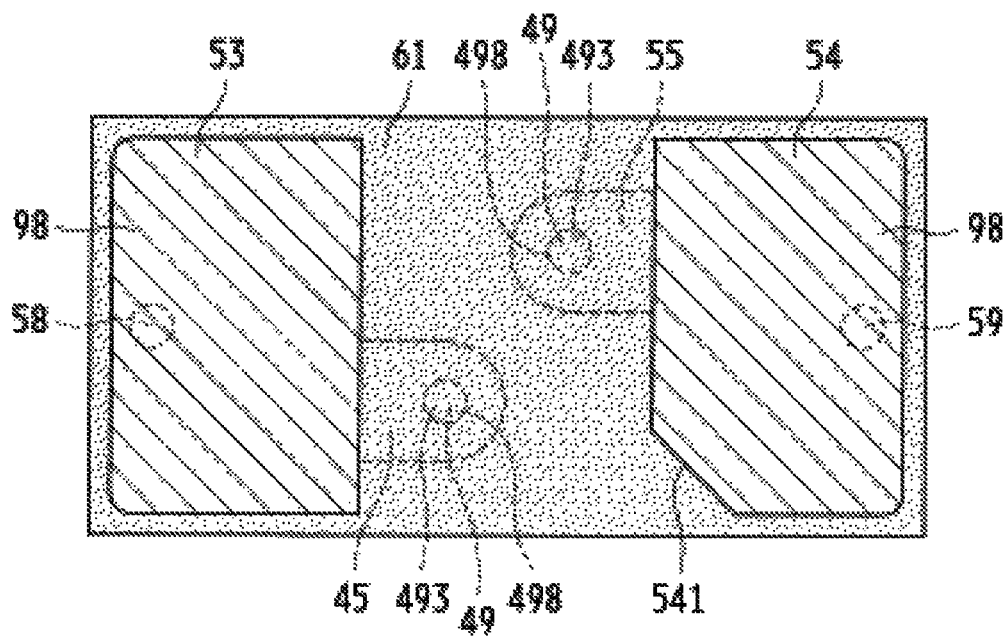
FIG. 4 is a schematic rear view of the base according to the embodiment of the present invention.
Figure 5:
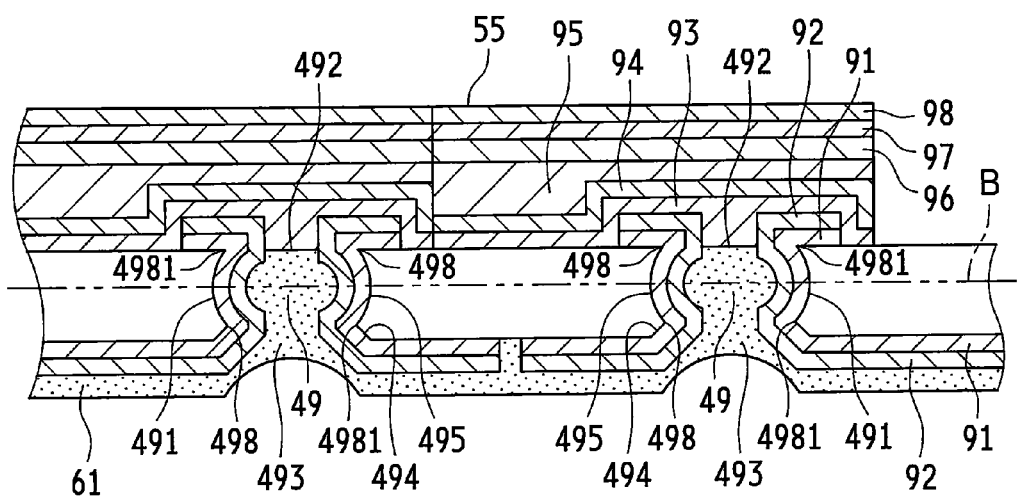
FIG. 5 is an enlarged schematic cross-sectional view of portions of through holes of the base shown in FIG. 2.

The through holes 49 are simultaneously formed with the cavity 45 at the time of etching of the base 4 by photolithography. As shown in FIGS. 1 to 5, the base 4 has two through holes 49 passing through between both main surfaces (one main surface 42 and the other main surface 43) of the base 4. As shown in FIG. 5, the inner side surface 491 of the through hole 49 is constituted by a flat surface 494 (part of the inner side surface 491) and a curved surface 495 (part of the inner side surface 491). The curved surface 495 is formed continuously from the one main surface 42 of the base 4 (base material). The flat surface 494 is formed continuously from the other main surface 43 of the base 4 (base material). The curved surface 495 is formed continuously from the flat surface 494. In this embodiment, the aspect ratio (ratio of the length to the width) of the through hole 49 is 1.3 (length: 145 µm, and width: 110 µm).

As shown in FIG. 5, the flat surface 494 is inclined relative to the one main surface 42 and the other main surface 43 of the base 4, and is formed in a tapered shape. Also, an angle between the one main surface 42 of the base 4 and the flat surface 494 of the inner side surface 491 of the through hole 49 is set substantially to 45 degrees. In this embodiment, the angle $\theta$ between the one main surface 42 of the base 4 and the inner side surface 491 of the through hole 49 is set substantially to 45 degrees, but it is not limited thereto. For example, the angle $\theta$ between the one main surface 42 of the base 4 and the inner side surface 491 of the through hole 49 may be more than 45 degrees. Specifically, such an angle may be 70 degrees to utmost 90 degrees. The larger the angle $\theta$ becomes, the smaller the diameter of the through hole 49 can be.

As shown in FIG. 5, the curved shape of the curved surface 495 is formed so as to expand outside the through hole 49 in the width direction and to have a convex shape. The curved surface 495 is constituted by a set of points radially spreading from the predetermined reference points 499 in the through hole 49 (see FIG. 12). The curved surface also has a fixed curvature. The curved surface 495 is a curved surface (spherical surface) of a sphere having the reference points 499 as the centers (center points). Also, normals of the spherical surface having the reference points 499 (see FIG. 12) as the centers are disposed on a surface B (virtual surface indicated by the two-dot chain line in FIG. 5). Here, there is a plurality of the predetermined reference points 499, and the plurality of reference points 499 is disposed on the single surface B. Thus, on the surface B, the reference points 499 are arranged in a circular line manner (not shown, an endless circular line in plan view). The surface direction of the surface B is the same as that of both main surfaces 42 and 43 of the base 4. Referring to the cross-sectional view of the base 4 in FIG. 5, the surface B is parallel to both main surfaces 42 and 43 of the base 4. Furthermore, the surface B is located nearer the one main surface 42 than the other main surface 43 of the base 4.

Also, as described above, the curved surface 495 has the plurality of reference points 499 (see FIG. 12) as the centers, and the normals having the reference points 499 as the centers are disposed on the surface B. Therefore, the diameter of the through hole 49 along the surface B has the largest width.

Furthermore, the inner side surface 491 of the through hole 49 includes two projections 498 that project into the hole. Projection end edges 4981 of the projections 498 are end edges of the curved surface 495. The two projections 498 according to this embodiment respectively have the circular shapes (see the through hole 49 in plan view indicated in FIG. 42). The inner side surface 491 of the through hole 49 between the two projections 498 is formed by the curved surface 495. In this embodiment, the two projections 498 are formed, but the present invention is not limited thereto. Having a plurality of projections is sufficient.

As shown in FIG. 5, the diameter of the other open end 493 of the through hole 49 at the side of the other main surface 43 of the base 4 is the same as, or substantially the same as, the diameter of one open end 492 of the through hole 49 at the side of the one main surface 42 of the base 4. In this embodiment, the opening size ratio of both open end (one open end 492 to the other open end 493) of the through hole 49 is 0.9 (one open end 492: φ100 μm, the other open end 493: φ110 μm).

On the inner side surface 491 of the through hole 49, the first seed film 91 and the second seed film 92 that are part of the wiring pattern 55 are formed. Furthermore, a resin material (for convenience sake, the reference numeral 61 is assigned), which is the same material as the resin pattern 61, is filled in the through hole 49. By the resin material 61, the through hole 49 is closed. As shown in FIG. 5, one end surface of the resin material 61 at the side of the one main surface 42 of the base 4 is flush with the surface of the one main surface 42 of the base 4, and the other end surface of the resin material 61 at the side of the other main surface 43 is formed so as to dent toward the one main surface 42.

Since the curved surface 495 is included in the inner side surface 491 of the through hole 49, the resin material 61 in the through hole 49 is filled along the curved surface 495, thus the resin material gets through the curved surface 495 so as to generate anchor effect. Thus, the anchor effect is exerted, which ensures adhesiveness between the resin material 61 and the inner side surface 491 of the through hole 49. With the configuration in which the resin material 61 gets through the through hole 49, the anchor effect is obtained, thereby the adhesive strength of the resin pattern 61 to the through hole 49 is improved.

As described above, on the other main surface 43 of the base material forming the base 4, the external terminal electrodes 53 and 54, the wiring pattern 55 and the resin pattern 61 are formed. On the base material of the other main surface 43 and the wiring pattern 55, the resin pattern 61 is layered. On the wiring pattern 55 and the resin pattern 61, the external terminal electrodes 53 and 54 are layered. On the other main surface 43, as shown in FIG. 4, the contact areas 58 and 59 are provided so as to contact the respective external electronic electrodes 53 and 54 with the wiring pattern 55. At the contact areas 58 and 59, the external terminal electrodes 53 and 54 are contacted with (layered on) the wiring pattern 55. That is, at the contact areas 58 and 59, the external terminal electrodes 53 and 54 are electrically connected to the wiring pattern 55. As shown in FIG. 4, in this embodiment, the respective contact areas 58 and 59 are provided in a resin pattern forming area 47. However, the number of the contact areas 58 and 59 is not limited thereto. Any number of contact areas 58 and 59 may be provided in the resin pattern forming area 47 (under the layers of the external terminal electrodes 53 and 54).

For the resin material 61 and the resin pattern 61, polybenzoxazole (PBO) is used. The material of the resin material 61 and the resin pattern 61 is not limited to the polybenzoxazole (PBO). Any resin material that has a good adhesiveness to the material forming the base 4 (for example, a glass material) may be used. Therefore, for the resin material forming the resin pattern 61, for example, benzocyclobutene (BCB), epoxy, polyimide, or a resin material made of fluororesin may be used. The resin material used in this embodiment for forming the resin pattern 61, i.e. polybenzoxazole (PBO), is a photosensitive resin material. On such a resin material, a pattern can be formed by photolithography. Here, the term photosensitive resin material of the present invention broadly encompasses, apart from resin materials made of photosensitive resin, photosensitive resin compositions containing a photosensitizing agent and resin.

Figure 6:
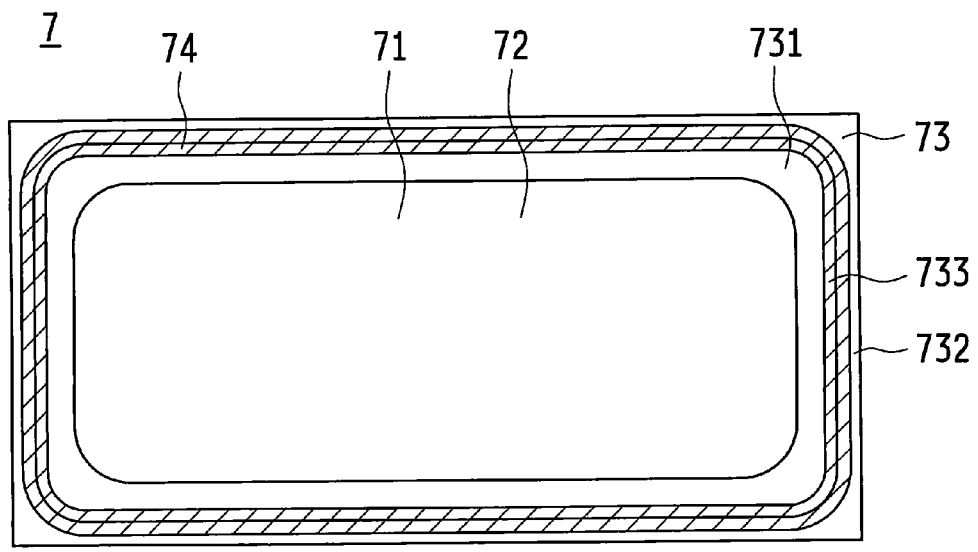
FIG. 6 is a schematic rear view of a lid according to the embodiment of the present invention.

The lid 7 is made of a glass material such as borosilicate glass. As shown in FIGS. 1 and 6, the lid 7 includes a top portion 71 and a wall portion 73 that extends from the top portion 71 downwardly along the outer periphery of one main surface 72 of the lid 7. To form such lid 7, a base material of a rectangular parallelepiped single plate is wet etched.

Both side surfaces of the wall portion 73 of the lid 7 (an inner side surface 731 and an outer side surface 732) each have a tapered shape. The wall portion 73 has a second bonding layer 74 to be bonded with the base 4.

As shown in FIG. 1, the second bonding layer 74 of the lid 7 extends over a top surface 733 and the outer surface 732 of the wall portion 73 of the lid 7. The second bonding layer 74 has a multiple-layer structure of a Ti film (not shown) made of Ti and a Au film (not shown) made of Au on the Ti film. The Ti film and the Au film are formed by sputtering. In this embodiment, although the second bonding layer 74 is made of the Ti film and the Au film, a Cu film made of Cu may be used instead of the Au film.

The bonding material 12 bonds the base 4 and the lid 7, and is layered on the second bonding layer 74 of the lid 7. The bonding material 12 has a multiple-layer structure of: a Au—Sn film (not shown) made of a Au—Sn alloy plated on the second bonding layer 74 of the lid 7; and a Au film (not shown) plated on the Au—Sn film. The Au film has a multiple-layer structure of a Au strike plated film and a Au plated film plated on the Au strike plated film. In the bonding material 12, the Au—Sn film is melted by heat melting into a AuSn alloy film. The bonding material 12 may be a AuSn alloy film plated on the second bonding layer 74 of the lid 7. While in this embodiment the bonding material 12 is layered on the second bonding layer 74 of the lid 7, it may also be layered on the first bonding layer 48 of the base 4.

The crystal resonator plate 2 is a Z-plate quartz crystal formed by wet etching a crystal blank (not shown) that is an anisotropic crystal plate.

As shown in FIG. 7, the crystal resonator plate 2 includes two leg portions 21 and 22 as oscillating portions, a base portion 23, and a bonding portion 24 to be bonded with the electrode pads 51 and 52 of the base 4. The two leg portions 21 and 22 project from the one end surface 231 of the base portion 23. The crystal resonator plate 2 also includes a piezoelectric resonator blank 20 formed by projection of the bonding portion 24 from the other end surface 232 of the base portion 23.

As shown in FIG. 7, the base portion 23 is bilaterally symmetrical in plan view. A side surface 233 of the base portion 23 has a portion at the side of the one end surface 231, and the portion has the same width as the width of the one end surface 231. The side surface 233 has a portion at the side of the other end surface 232, and the portion gradually diminishes in width from the side of the one end surface 231 toward the side of the other end surface 232.

As shown in FIG. 7, the two leg portions 21 and 22 project in the same direction from the one end surface 231 of the base portion 23. Distal end portions 211 and 221 of the two leg portions 21 and 22 have larger widths than the widths of the other portions of the leg portions 21 and 22 (the wideness in width being in the direction perpendicular to the projecting direction). Each of the distal end portions 211 and 221 has round distal corners. Both main surfaces of each of the two leg portions 21 and 22 have groove portions 25 for improvement of the CI value.

As shown in FIG. 7, the bonding portion 24 projects from a center portion of the other end surface 232 of the base portion 23 in the width direction. The bonding portion 24 includes a shorter side portion 241 and a longer side portion 242. The shorter side portion 241 projects perpendicular to the other end surface 232 of the base portion 23 in plan view. The longer side portion 242 is coupled with an end portion of the shorter side portion 241 and extends in the width direction of the base portion 23. The longer side portion 242 has a distal end portion 243 oriented in the width direction of the base portion 23. That is, the bonding portion 24 has an L shape in plan view, which is folded at a right angle in plan view. The bonding portion 24 also has two bonding points 27 to be connected to the electrode pads 51 and 52 of the base 4 via the conductive bump 13.

The crystal resonator plate 2 thus configured includes the first and second excitation electrodes 31 and 32 that have different potentials, and extraction electrodes 33 and 34 respectively extended from the first and second excitation electrodes 31 and 32 to electrically connect the first and second excitation electrodes 31 and 32 to the electrode pads 51 and 52 of the base 4.

Parts of the first and second excitation electrodes 31 and 32 are disposed inside the groove portions 25 of the leg portions 21 and 22. This minimizes vibration loss of the leg portions 21 and 22 even if the crystal resonator plate 2 is downsized, thus minimizing the CI value.

The first excitation electrode 31 is disposed at both main surfaces of the one leg portion 21, at both side surfaces of the other leg portion 22, and at both main surfaces of the distal end portion 221. Similarly, the second excitation electrode 32 is disposed at both main surfaces of the other leg portion 22, at both side surfaces of the one leg portion 21, and at both main surfaces of the distal end portion 211.

The extraction electrodes 33 and 34 are disposed on the base portion 23 and the bonding portion 24. The extraction electrode 33 on the base portion 23 connects the first excitation electrode 31 on both main surfaces of the one leg portion 21 to the first excitation electrode 31 on both side surfaces of the other leg portion 22 and to the first excitation electrode 31 on both main surfaces of the distal end portion 221. The extraction electrode 34 on the base portion 23 connects the second excitation electrode 32 on both main surfaces of the other leg portion 22 to the second excitation electrode 32 on both side surfaces of the one leg portion 21 and to the second excitation electrode 32 on both main surfaces of the distal end portion 211.

The base portion 23 has two through holes 26 passing through both main surfaces of the piezoelectric resonator blank 20. The through holes 26 are filled with a conducting material. The extraction electrodes 33 and 34 are extended between both main surfaces of the base portion 23 via the through holes 26.

As shown in FIG. 1, in the crystal resonator 1 thus configured, the bonding portion 24 of the crystal resonator plate 2 is electrically and mechanically bonded by ultrasonic bonding of FCB to the pedestal portion 46 on the one main surface 42 of the base 4 via the conductive bump 13. The bonding electrically and mechanically bonds the excitation electrodes 31 and 32 of the crystal resonator plate 2 to the electrode pads 51 and 52 of the base 4 via the extraction electrodes 33 and 34 and the conductive bump 13. Thus, the crystal resonator plate 2 is mounted on the base 4. Then, the lid 7 is temporarily bonded by FCB to the base 4 on which the crystal resonator plate 2 is mounted. Then, the resulting product is heated in a vacuum atmosphere to melt the bonding material 12, the first bonding layer 48, and the second bonding layer 74. This causes the first bonding layer 48 of the base 4 to be bonded to the second bonding layer 74 of the lid 7 via the bonding material 12, thus producing the crystal resonator 1 that hermetically encloses the crystal resonator plate 2. The conductive bump 13 used is a bump plating made of a non-liquid member.

Next, a method for producing the crystal resonator 1 and the base 4 will be described below with reference to FIGS. 8 to 20.

This embodiment uses a single plate wafer 8 which is made of an isotropic material and from which a number of bases 4 are formed. Specifically, a glass material is used for the wafer 8.

Figure 8:
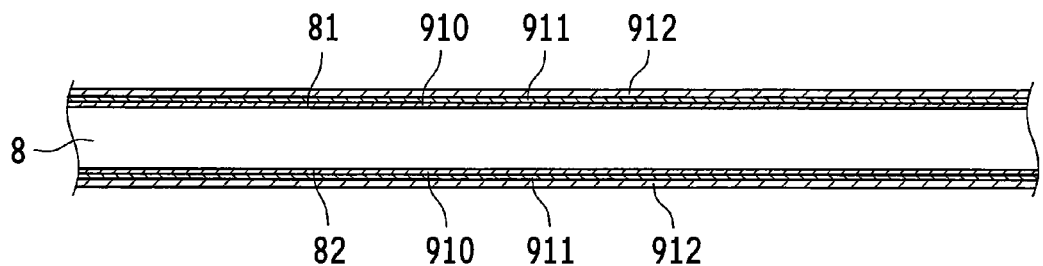
FIG. 8 is a schematic partial cross-sectional view of a wafer in a step of a production process of the base according to the embodiment of the present invention.

As shown in FIG. 8, a Cr film 910 made of Cr is formed by sputtering on both main surfaces 81 and 82 of the wafer 8. On the Cr film 910, a Au film 911 made of Au is formed by sputtering. On the Au film 911, a resist is applied by spin coating to form a positive resist layer 912.

After forming the positive resist layer 912, exposure and development by photolithography are carried out with respect to each of the positive resist layers 912 on the main surfaces 81 and 82 of the wafer 8 so as to form part of the cavity 45 except the pedestal portion 46, and recess portions 496 for forming the flat surfaces 494 of the through holes 49. Then, the exposed Cr film 910 and Au film 911 are metal etched to form a prescribed pattern (part of the cavity 45 except the pedestal portion 46 and the recess portions 496 for forming the flat surfaces 494 of the through holes 49), as shown in FIG. 9.

Figure 9:
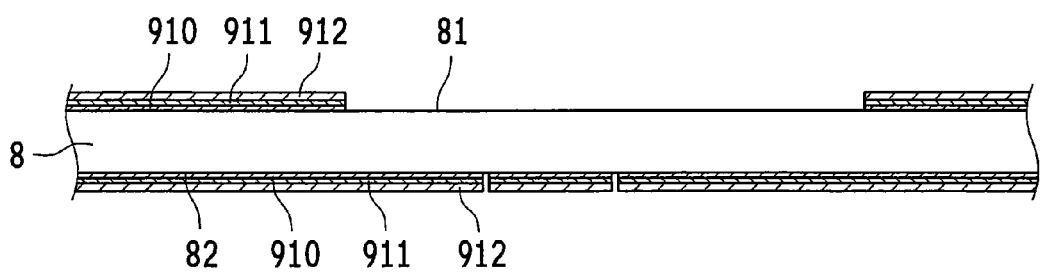
FIG. 9 is a schematic partial cross-sectional view of the wafer in a step of the production process of the base according to the embodiment of the present invention.
Figure 10:
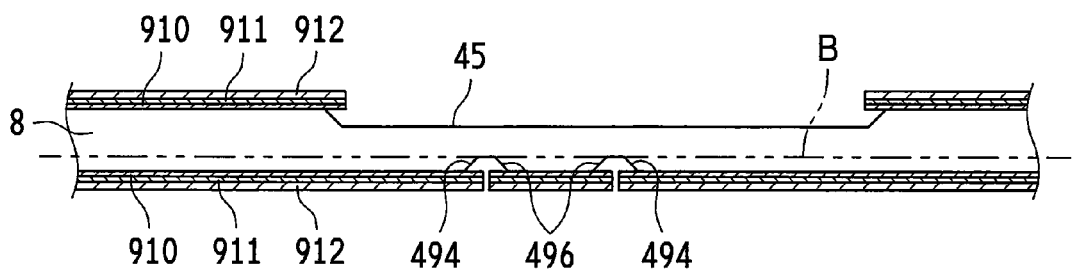
FIG. 10 is a schematic partial cross-sectional view of the wafer in a step of the production process of the base according to the embodiment of the present invention.

After the prescribed pattern has been formed as shown in FIG. 9, the wafer 8 is wet etched using photolithography. Thus, a number of bases 4 are formed with respect to the wafer 8, and each base 4 includes part of the cavity 45 except the pedestal portion 46, and the recess portions 496 for forming the flat surfaces 494 of the through holes 49, as shown in FIG. 10. Here, each bottom portion inside the recess portions 496 serve as a reference surface for setting the surface B (virtual surface indicated by the two-dot chain line in FIG. 10). Also, the inner side surfaces of the recess portions 496 are flat surfaces (flat surfaces 494), but are not limited thereto. Any tapered surfaces will be sufficient that are tapered relative to the other main surface 82 of the wafer 8 (see the other main surface 43 of the base 4). For this reason, the tapered surface may include, at least in part thereof, a curved surface expanding in the wet-etching direction.

Figure 11:
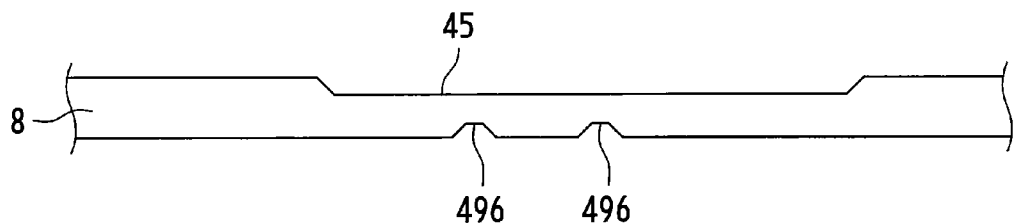
FIG. 11 is a schematic partial cross-sectional view of the wafer in a step of the production process of the base according to the embodiment of the present invention.

After forming the part of the cavity 45 except the pedestal portion 46, and the recess portions 496 for forming the flat surfaces 494 of the through holes 49 with respect to the wafer 8, the positive resist layer 912, the Cr film 910 and the Au film 911 are delaminated and removed to make the blank wafer 8, as shown in FIG. 11. The steps up to here are part of a forming process of the present invention, and are called a first forming step.

In order to form, with respect to the wafer 8 as shown in FIG. 11, the cavity 45 including the pedestal portion 46, the through holes 49 (curved surfaces 495), and the outer periphery edge of the other main surface 43 of the base 4, a new Cr film 910 is formed by sputtering on both main surfaces 81 and 82 of the wafer 8. On the Cr film 910, a new Au film 911 is formed by sputtering. On the Au film 911, a resist is applied by electrodeposition coating (or spray coating), thus a new positive resist layer 912 is formed. In this embodiment, since electrodeposition coating (or spray coating) is used for forming the mew positive resist layer 912, the new positive resist layer 912 can be formed on inner surfaces 497 (inner side surfaces and inner bottom surfaces) of the recess portions 496.

Figure 12:
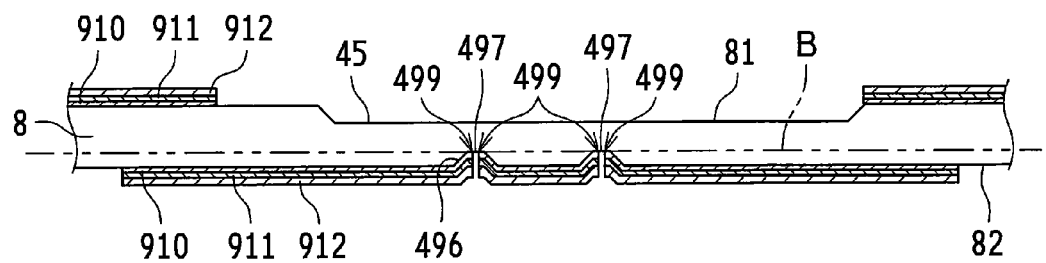
FIG. 12 is a schematic partial cross-sectional view of the wafer in a step of the production process of the base according to the embodiment of the present invention.

After forming the new positive resist layer 912, in order to form the cavity 45 including the pedestal portion 46, the curved surfaces 495 of the through holes 49, and the outer periphery edge of the other main surface 43 of the base 4, exposure and development by photolithography are carried out with respect to each of the positive resist layers 912 of the main surfaces 81 and 82 of the wafer 8. Then, the exposed Cr film 910 and Au film 911 are etched to form a prescribed pattern (the cavity 45 including the pedestal portion 46, the curved surfaces 495 of the through holes 49, and the outer periphery edge of the other main surface 43 of the base 4), as shown in FIG. 12. In the recess portion 496, at this time, the positive resist layer 912, the Cr film 910 and the Au film 911 are delaminated and removed from only the center portion of the inner bottom surface. Here, the positive resist layer 912 (including the Cr film 910 and the Au film 911) is formed on the bottom surface inside the recess portion 496. An exposed end edge of the center portion (see the points indicated by the reference numeral 499 in FIG. 12) exposed from the positive resist layer 912 is a line made by the multiple reference points 499 (endless perfect circular line in plan view). Such an exposed portion is an opening pattern. The multiple reference points 499 are on the surface B (virtual surface indicated by the two-dot chain line in FIG. 12).

Figure 13:
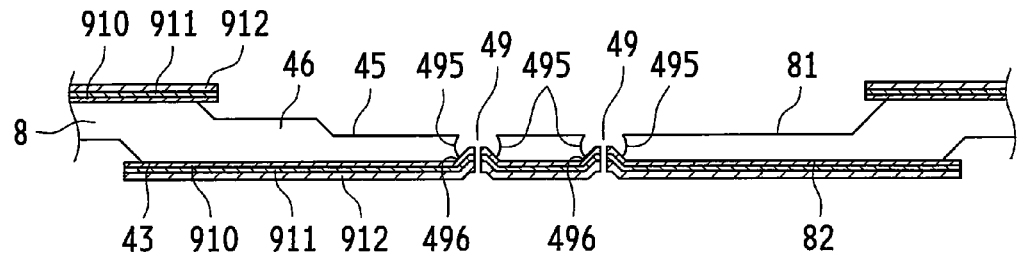
FIG. 13 is a schematic partial cross-sectional view of the wafer in a step of the production process of the base according to the embodiment of the present invention.

After the prescribed pattern has been formed as shown in FIG. 12, the wafer 8 is wet etched using photolithography. By the etching here, the wafer 8 is melted (etched) in a radial fashion from the plurality of reference points 499, since in this embodiment, an isotropic material is used for the wafer 8. With respect to the wafer 8, a number of bases 4 are formed. As shown in FIG. 13, each base 4 includes the cavity 45, the through holes 49 and the outer periphery edge of the other main surface 43.

Figure 14:
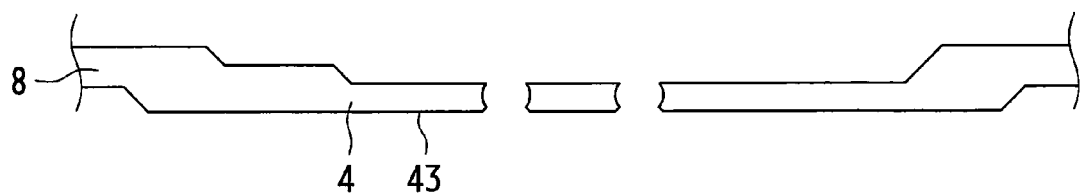
FIG. 14 is a schematic partial cross-sectional view of the wafer in a step of the production process of the base according to the embodiment of the present invention.

After forming the cavity 45, the through holes 49 and the outer periphery edge of the other main surface 43 with respect to the wafer 8, the positive resist layer 912, the Cr film 910 and the Au film 911 are delaminated and removed, as shown in FIG. 14. Thus, the blank wafer 8 is made, with respect to which a plurality of base 4 is formed. The steps up to here are part of the forming process of the present invention, and are called a second forming step. In the second forming step, it is not considered, at the time of filing the application, to use physical etching (dry etching and the like) in order to form the curved surfaces 495 of the base 4 downsized from the crystal resonator 1 (base 4), in consideration of accuracy for forming the surfaces and costs to be incurred. Furthermore, the forming process consists of the first forming step and the second forming step.

On the wafer 8 (both main surfaces 81 and 82, the inner side surfaces 491 of the through holes 49 and the like) as shown in FIG. 14, a Mo layer made of Mo (first seed film 91) is formed by sputtering. After forming the first seed film 91, a Cu layer made of Cu (second seed film 92) is formed by sputtering on the first seed film 91.

After formation of the first seed film 91 and the second seed film 92, a resist is applied on the second seed film 92 by dip coating, thus forming a new positive resist layer 912. Then, in order to form a prescribed pattern corresponding to the inner side surfaces 491 of the through holes 49 and their vicinities, and the wiring pattern of the other main surface 43 of the base 4, exposure and development by photolithography are carried out with respect to the positive resist layer 912. After that, with respect to the exposed parts by exposure and development, the first seed film 91 and the second seed film 92 are metal etched. After metal etching of the first seed film 91 and the second seed film 92, the positive resist layer 912 is delaminated and removed (see FIG. 15). Part of the wiring pattern 55 of the base 4 as shown in FIG. 1 is constituted by the first seed film 91 and the second seed film 92 formed here.

Figure 15:
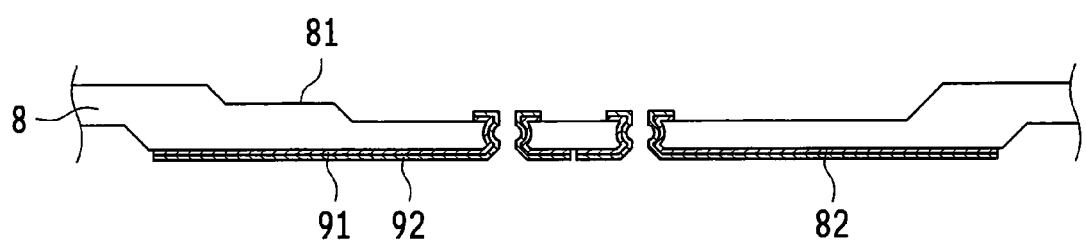
FIG. 15 is a schematic partial cross-sectional view of the wafer in a step of the production process of the base according to the embodiment of the present invention.
Figure 16:
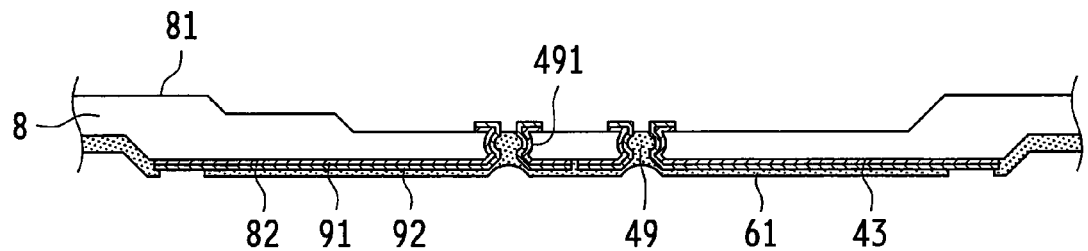
FIG. 16 is a schematic partial cross-sectional view of the wafer in a step of the production process of the base according to the embodiment of the present invention.
Figure 17:
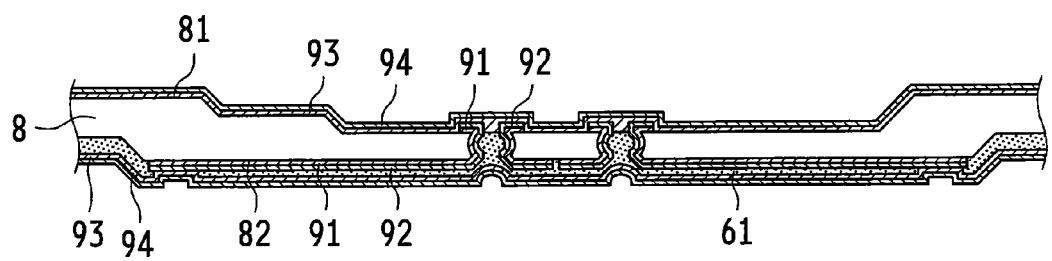
FIG. 17 is a schematic partial cross-sectional view of the wafer in a step of the production process of the base according to the embodiment of the present invention.
Figure 18:
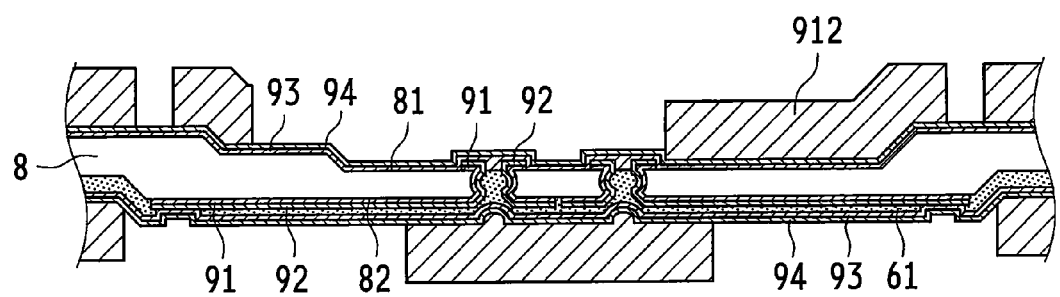
FIG. 18 is a schematic partial cross-sectional view of the wafer in a step of the production process of the base according to the embodiment of the present invention.

With respect to the wafer 8 as shown in FIG. 15, a resist is applied by dip coating, thus forming a new positive resist layer 912. Then, in order to form a prescribed pattern on the inner side surfaces 491 of the through hole 49 and their vicinities and on the other main surface 43 of the base 4, exposure and development by photolithography are carried out with respect to the positive resist layer 912. After that, a resin layer 61 is formed on the main surfaces 81 and 82 of the wafer 8. After forming the resin layer 61, the positive resist layer 912 is delaminated and removed, thus forming a resin pattern 61, as shown in FIG. 16, on the through holes 49 and the other main surface 43 of the base 4.

After forming the resin pattern 61, a Mo layer made of Mo (first sputtered film 93) is formed by sputtering on both main surfaces 81 and 82 of the wafer 8. After forming the first sputtered film 93, a Cu layer made of Cu (second sputtered film 94) is formed by sputtering on the first sputtered film 93 (see FIG. 17).

After forming the first sputtered film 93 and the second sputtered film 94, a resist is applied on the second sputtered film 94 by dip coating, thus forming a new positive resist layer 912. After that, for forming a first plated layer 95-a fourth plated layer 98, exposure and development by photolithography are carried out with respect to the positive resist layer 912 (see FIG. 18).

After exposure and development of the positive resist layer 912, the first plated layer 95 is formed on both main surfaces 81 and 82 of the wafer 8, and the second plated layer 96 is formed on the first plated layer 95. The third plated layer 97 is formed on the second plated layer 96, and the fourth plated layer 98 is formed on the third plated layer 97 (see FIG. 19).

Figure 19:
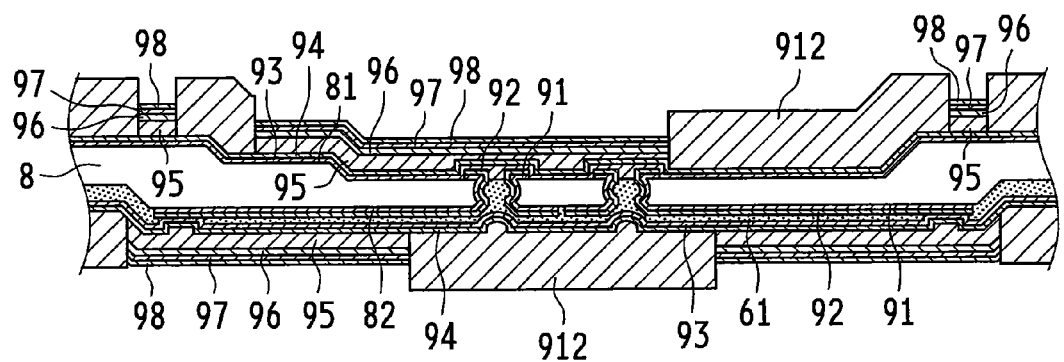
FIG. 19 is a schematic partial cross-sectional view of the wafer in a step of the production process of the base according to the embodiment of the present invention.
Figure 20:
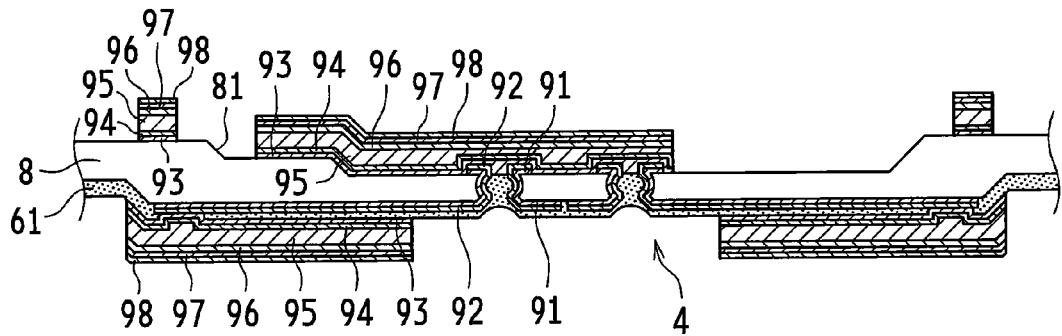
FIG. 20 is a schematic partial cross-sectional view of the wafer in a step of the production process of the base according to the embodiment of the present invention.

As shown in FIG. 19, after forming the first plated layer 95-the fourth plated layer 98, the positive resist layer 912, and the first sputtered film 93 and the second sputtered film 94 under the positive resist layer 912 are removed, thus forming a number of bases 4 with respect to the wafer 8 (see FIG. 20). The electrode pads 51 and 52 of the base 4, part of the wiring pattern 55, and the first bonding layer 48 shown in FIG. 1 are constituted by the first sputtered film 93, second sputtered film 94, and the first plated layer 95-the fourth plated layer 98 that are formed here.

Figure 2:
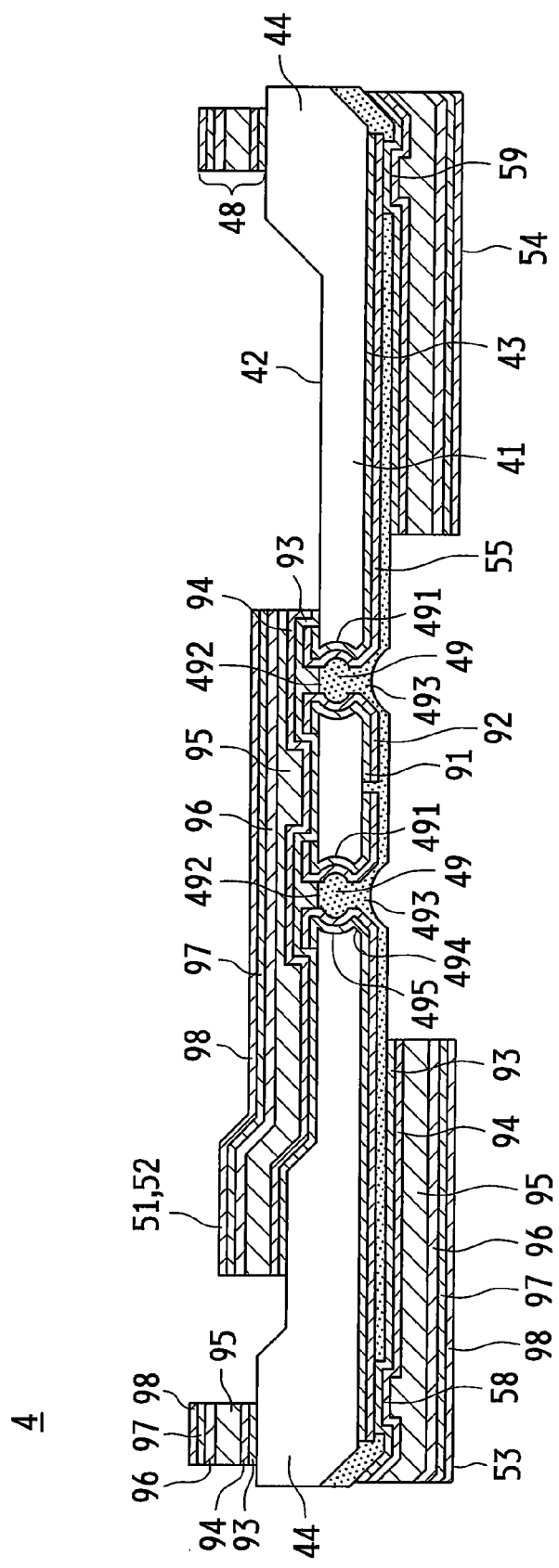
FIG. 2 is a cross-sectional view taken along the line A-A shown in FIG. 3.
Figure 3:
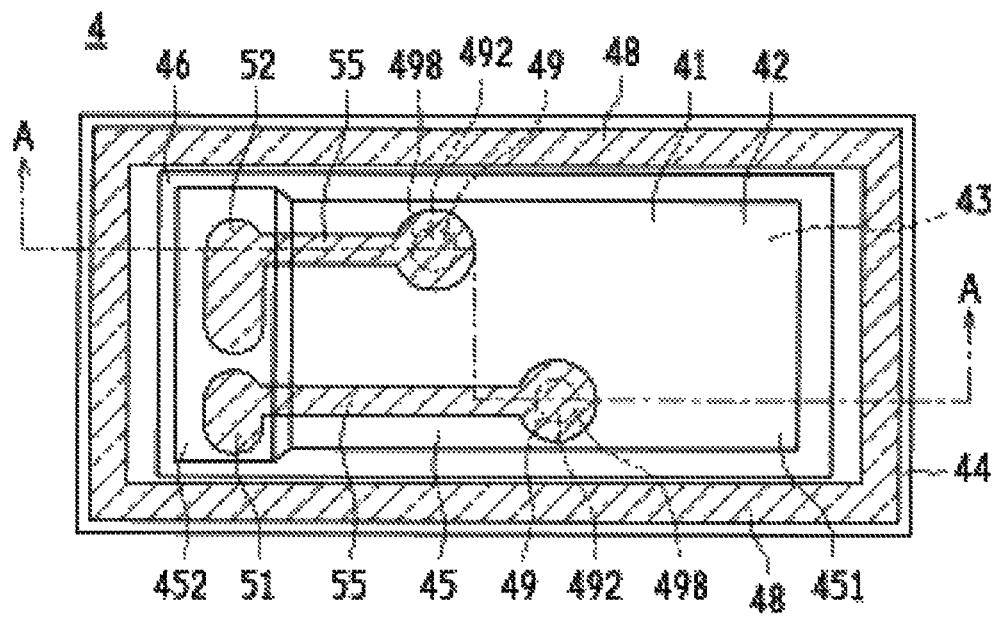
FIG. 3 is a schematic plan view of the base according to the embodiment of the present invention.

After forming a number of the bases 4 with respect to the wafer 8, such bases 4 are divided into individual bases 4 (base dividing step), thus producing a number of the bases 4 shown in FIG. 2.

Then, based on the position of the cut-out portion 541, the crystal resonator plate 2 shown in FIG. 7 is disposed on the base 4 shown in FIG. 2. The crystal resonator plate 2 is electrically and mechanically bonded to the base 4 via the conductive bump 13 by ultrasonic bonding of FCB, thus mounting and holding the crystal resonator plate 2 on the base 4. In another step, the bonding material 12 is layered on the second bonding layer 74 of the lid 7 shown in FIG. 6. Then the lid 7 is disposed on the base 4 on which the crystal resonator plate 2 is mounted and held. The first bonding layer 48 of the base 4 and the second bonding layer 74 of the lid 7 are electrically and mechanically bonded to one another via the bonding material 12 by ultrasonic bonding of FCB. Thus, the crystal resonator 1 shown in FIG. 1 is produced.

As described above, in the method for producing the crystal resonator 1, and the base 4 according to this embodiment, the curved surface 495 is included in the inner side surface 491 of the through hole 49. Thus, compared to the above-described prior art in which the inner side surface of the through hole is entirely tapered, the through hole 49 can be formed even if the widths of both open ends (one open end 492, the other open end 493) of the through hole 49 are made narrow. In the result, the open ends (one open end 492, the other open end 493) of the through hole 49 can be made small so that the exclusive areas occupied by the open ends (one open end 492, the other open end 493) of the through hole 49 on both main surfaces 42 and 43 of the base 4 can be small. Furthermore, in this embodiment, the anchor effect can be exerted with respect to the material filled in the through hole 49. Particularly, the anchor effect by the curved surface is more effective than the anchor effect by the flat surface.

On the inner side surface 491 of the through hole 49, two projections 498 are formed, and the projection end edges 4981 of the projections 498 are end edges of the curved surface 495. Thus, by the projection end edges 4981 and the curved surface 495, the anchor effect can be exerted effectively with respect to the material filled in the through hole 49.

The curved surface 495 is formed between the two projections 498. Thus, by the two projections 498 and the curved surface 495, the anchor effect can be exerted with respect to the perpendicular directions (both directions) that are perpendicular to both main surfaces 42 and 43 of the base 4 (base material).

The curved surface 495 of the through hole 49 is formed continuously from the one main surface 42 of the base 4 (base material). The tapered flat surface 494 of the through hole 49 is formed continuously from the other main surface 43 of the base 4 (base material). The curved surface 495 is formed continuously from the flat surface 494. Thus, it is possible not only that the exclusive areas occupied by the open ends (one open end 492, the other open end 493) of the through hole 49 on both main surfaces 42 and 43 of the base 4 are made small, but also that the curved surface 495 prevents the material filled in the through hole 49 from overflowing from the one main surface 42 of the base 4 (base material). Furthermore, the flat surface 494 is formed continuously from the other main surface 43 of the base 4 (base material), thus a filling material can be easily filled in the through hole 49 by filling the filling material (in this embodiment, the resin material 61) from the flat surface 494 into the through hole 49.

In the crystal resonator 1 according to this embodiment, the resin material 61 is formed on the second seed film 92 of the inner side surface of the through hole 49. However, a conductive material may be filled in the through hole 49. That is, a Cu plated layer may be formed on the second seed film 92 of the inner side surface of the through hole 49, or a metal paste (a resin material paste with a conductive filler added thereto) may be filled in the through hole 49.

In the base 4 of the crystal resonator 1 according to this embodiment, the first seed film 91 is made of a Mo film, however, it is not limited thereto. A Ti film made of Ti may be used instead of the Mo film.

In this embodiment, a glass material is used for the base 4 and the lid 7. However, the material of the base 4 and lid 7 is not limited to glass provided that it is an isotropic material.

In this embodiment, AuSn is mainly used as the bonding material 12. However, the bonding material 12 is not limited thereto provided that it can bond the base 4 to the lid 7. For example, Sn alloy brazing filler metal of CuSn or the like may be used.

In the crystal resonator 1 according to this embodiment, the tuning-fork crystal resonator plate 2 shown in FIG. 7 is used as the crystal resonator plate. However, an AT-cut crystal resonator plate may also be used.

In addition to the crystal resonator plate 2, an IC chip may be mounted on the base 4 according to this embodiment to configure an oscillator. Mounting an IC chip on the base 4 involves formation of electrodes on the base 4 in conformity of the electrode configuration of the IC chip.

In this embodiment, the two-terminal crystal resonator 1 is used. However, this embodiment is not limited thereto. It can be applied to a four-terminal crystal resonator as the crystal resonator 1.

Figure 21:
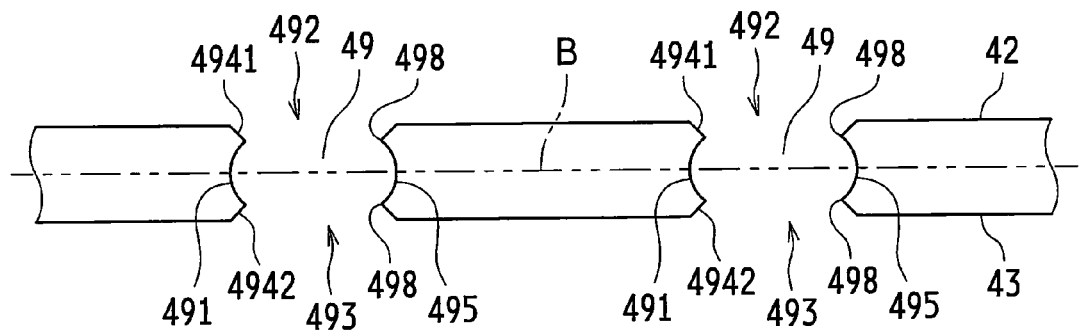
FIG. 21 is an enlarged schematic cross-sectional view of portions of through holes of a base, showing only a substrate of the base according to another embodiment of the present invention, corresponding to FIG. 5.

In this embodiment, one flat surface 494 and one curved surface 495 consist of the inner side surface 491 of the through hole 49. However, the configuration is not limited thereto. As shown in FIG. 21, two flat surfaces (a first flat surface 4941 and a second flat surface 4942) and one curved surface 495 may consist of the inner side surface 491 of the through hole 49. In the through hole 49 of the base 4 shown in FIG. 21, the inner side surface 491 consists of the tapered first flat surface 4941, the tapered second flat surface 4942 and the curved surface 495. Regarding the specific configuration of the through hole 49, the first flat surface 4941 is formed continuously from the one main surface 42 of the base 4 (base material), the curved surface 495 is formed continuously from the first flat surface 4941, the second flat surface 4942 is formed continuously from the other main surface 43 of the base 4 (base material), and the curved surface 495 is formed continuously from the second flat surface 4942.

With the through hole 49 shown in FIG. 21, it is possible not only that the exclusive areas occupied by the open ends (one open end 492, the other open end 493) of the through hole 49 on both main surfaces 42 and 43 of the base 4 are made small, but also that the filling material is filled in the through hole 49 from either the first flat surface 4941 or the second flat surface 4942. Thus, the filling material is easily filled in the through hole 49.

Figure 22:
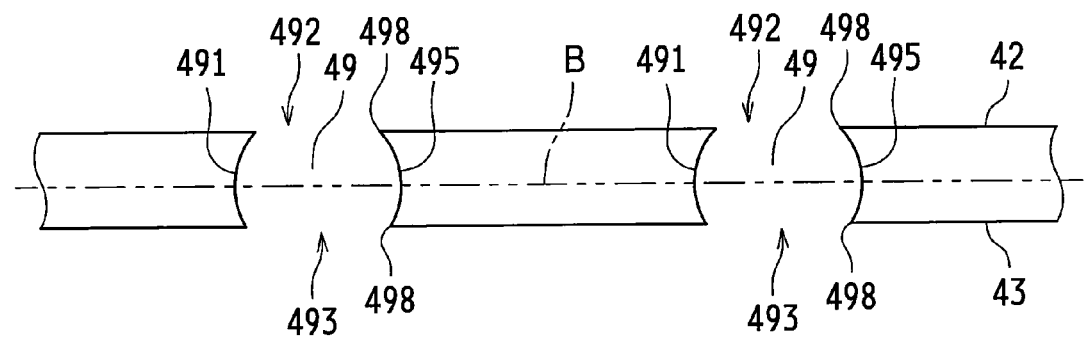
FIG. 22 is an enlarged schematic cross-sectional view of portions of through holes of a base, showing only a substrate of the base according to another embodiment of the present invention, corresponding to FIG. 5.

In this embodiment, the forming process with respect to the forming of the through hole 49 consists of the first forming step and the second forming step. However, the forming process is not limited thereto. The through hole 49 may be formed by a third forming step in which a curved surface, which is part of the inner side surface 491 of the through hole 49, is formed so as to expand outward in the width direction of the through hole 49. In the third forming step, the recess portion 496 having the inner surface 497 (inner side surface and bottom surface) as the flat surface is formed in the base material by wet etching. The bottom surface of the recess portion 496 is wet etched to form the curved surface 495. The through holes 49 formed in the third forming step are illustrated in FIG. 22. The inner side surface 491 of the through hole 49 shown in FIG. 22 is made of only the curved surface 495. The reference points 499 for forming the curved surface 495 shown in FIG. 22 are disposed on the surface B as the reference surface. In this embodiment shown in FIG. 22, the inner side surface 491 of the through hole 49 is constituted by only the curved surface 495. Thus, it is possible not only that the exclusive areas occupied by the open ends (one open end 492, the other open end 493) of the through hole 49 on both main surfaces 42 and 43 of the base 4 are made small, but also that the curved surface 495 prevents the material filled in the through hole 49 from overflowing from both main surfaces 42 and 43 of the base 4 (base material).

Figure 23:
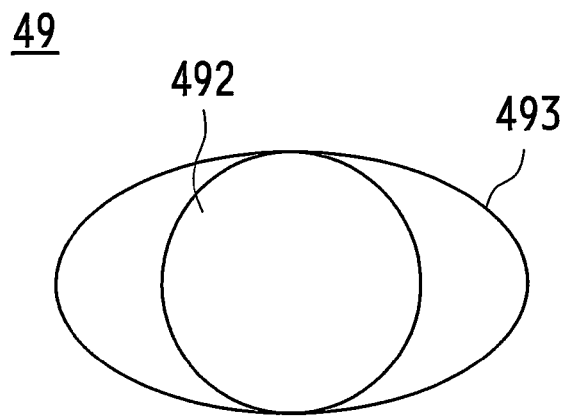
FIG. 23 is a schematic plan view of a through hole viewed from the other open end of the through hole, for schematically illustrating the through hole according to another embodiment of the present invention.

In this embodiment, the curved surface 495 having the fixed curvature is formed in the through hole 49. However, so far as the curved surface is constituted by a set of points radially spreading from the reference points 499 (see FIG. 12), the curved surface may have a variable curvature. Specifically, as shown in FIG. 23, one of the open ends (the other open end 493) of the through hole 49 may have an ellipse shape. In FIG. 23, the one open end 492 has a perfect circular shape. Thus, the shapes and sizes of the one open end 492 and the other open end 493 are different from each other.

Figure 24:
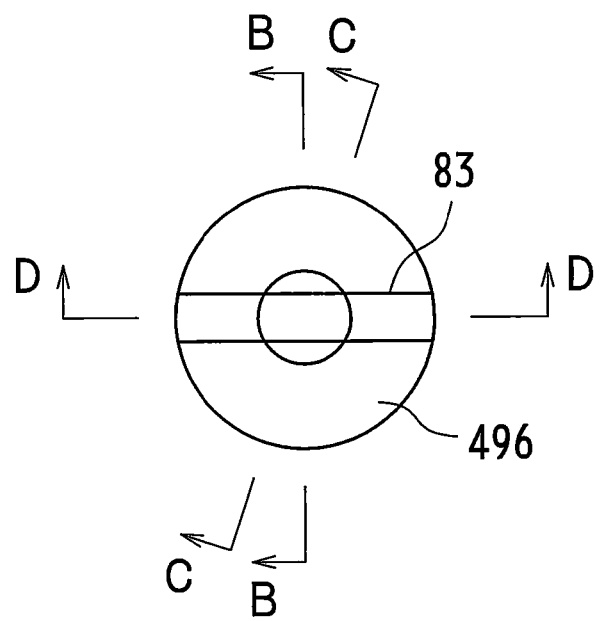
FIG. 24 is a schematic plan view of a recess portion for forming a through hole according to another embodiment of the present invention, the recess portion in which an opening pattern is formed.
Figure 25:
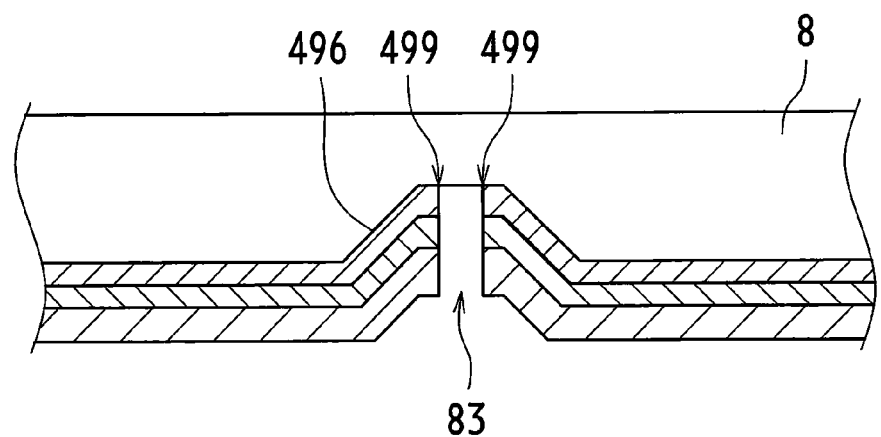
FIG. 25 is a schematic partial cross-sectional view of a wafer in a step of a production process of a base according to another embodiment of the present invention, which is a cross sectional view taken along the line B-B shown in FIG. 24 illustrating the recess portion.
Figure 26:
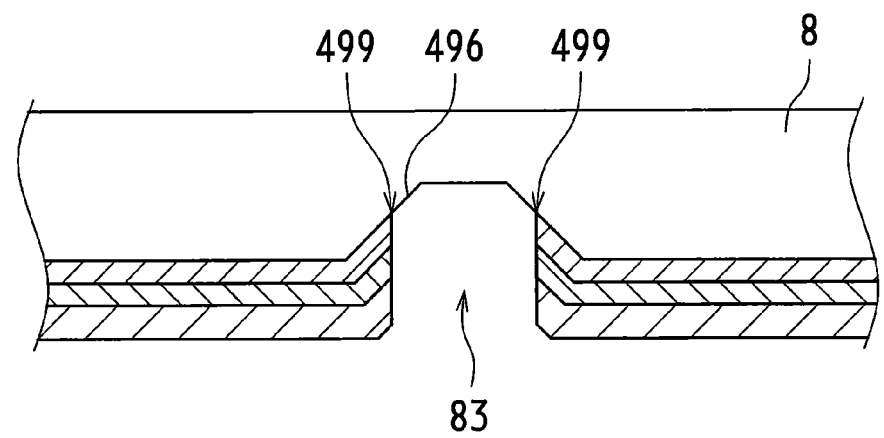
FIG. 26 is a schematic partial cross-sectional view of the wafer in a step of the production process of the base according to another embodiment of the present invention, which is a cross sectional view taken along the line C-C shown in FIG. 24 illustrating the recess portion.
Figure 27:
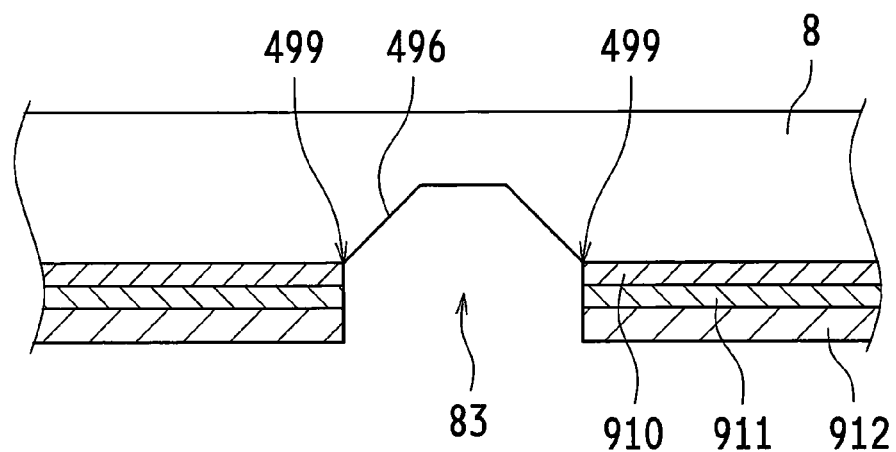
FIG. 27 is a schematic partial cross-sectional view of the wafer in a step of the production process of the base according to another embodiment of the present invention, which is a cross sectional view taken along the line D-D shown in FIG. 24 illustrating the recess portion.
Figure 28:
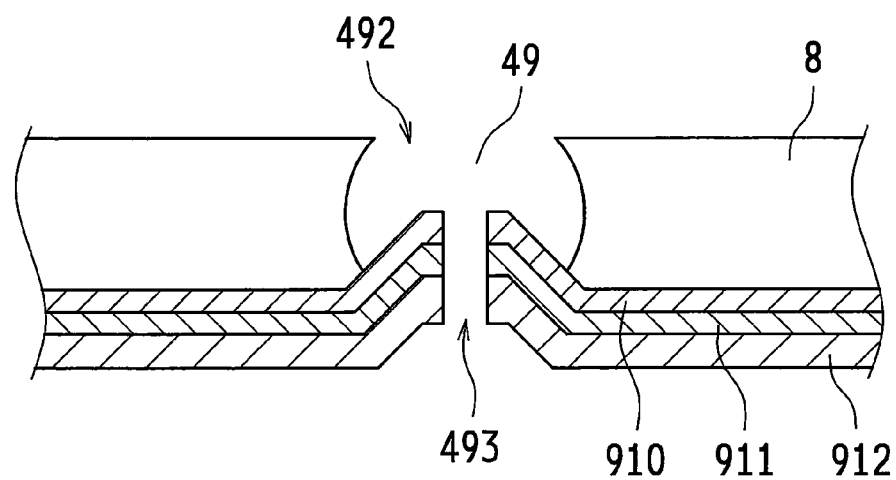
FIG. 28 is a schematic partial cross-sectional view of the wafer in a step of the production process of the base according to another embodiment of the present invention, where the recess portion shown in FIG. 25 is etched.
Figure 29:
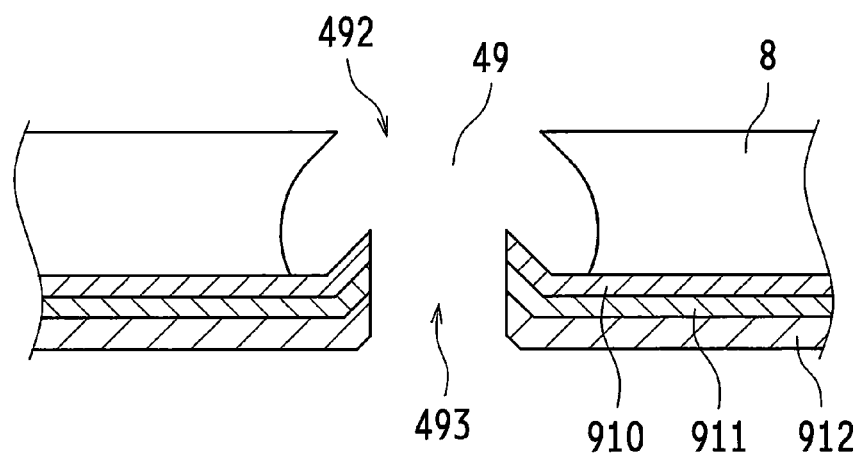
FIG. 29 is a schematic partial cross-sectional view of the wafer in a step of the production process of the base according to another embodiment of the present invention, where the recess portion shown in FIG. 26 is etched.
Figure 30:
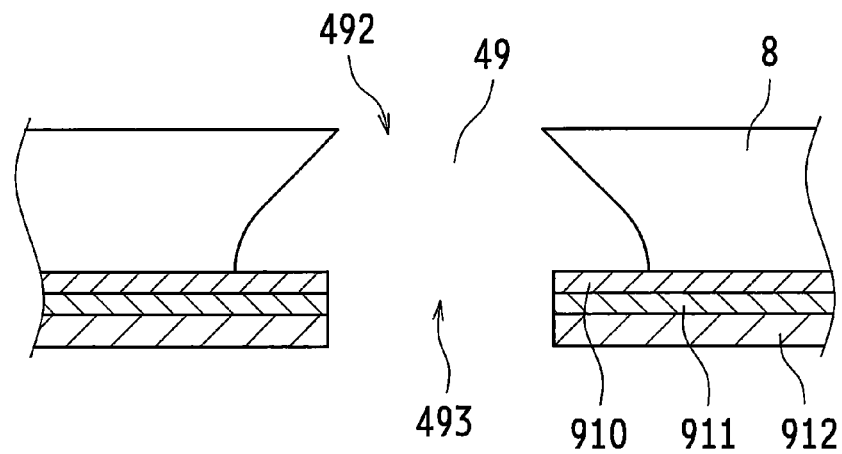
FIG. 30 is a schematic partial cross-sectional view of the wafer in a step of the production process of the base according to another embodiment of the present invention, where the recess portion shown in FIG. 27 is etched.

As described above, the through hole 49 shown in FIG. 23 includes the one open end 492 having a perfect circular shape and the other open end 493 having an ellipse shape, thereby, the cross-sectional shape of the through hole 49 is variable as shown in FIGS. 28 to 30. In this embodiment, the through hole 49 is formed which has the other open end 493 having an ellipse shape, using an opening pattern 83 having a rectangular shape in plan view as shown in FIGS. 24 to 27. As shown in FIG. 24, in the opening pattern 83 having a quadrilateral (substantially rectangular) shape in plan view, the short sides correspond to the open end of the recess portion 496, that is, the short sides each make a curved line, not a straight line.

Regarding producing of the through hole 49 shown in FIG. 23, in this embodiment, an isotropic material is used for the wafer 8. For this reason, when the opening pattern 83 is a rectangle in plan view and the wafer 8 is melted (etched) radially from the plurality of reference points 499 that constitute the opening pattern 83, the other open end 493 has an ellipse shape. With the through hole 49 including the other open end 493 having an ellipse shape, the projection end edge in the through hole 49 can be partially smoothed. That is, the sharp angle of the projection is suppressed and the projection end edge can be smoothed.

Figure 31:
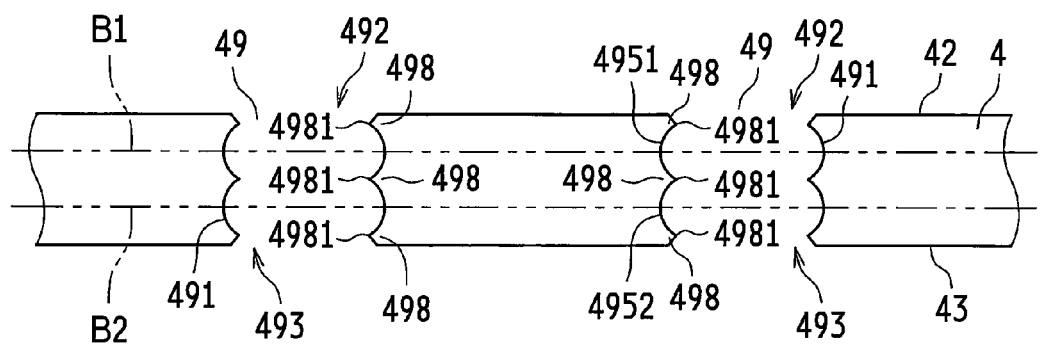
FIG. 31 is an enlarged schematic cross-sectional view of portions of through holes of a base, showing only a substrate of the base according to another embodiment of the present invention, corresponding to FIG. 5.

In each embodiment as described above, one curved surface 495 is included in the inner side surface 491 of the through hole 49, however, the embodiment is not limited thereto. As shown in FIG. 31, a plurality of curved surfaces 4951 and 4952 may be included in the through hole 49. In FIG. 31, the two curved surfaces 4951 and 4952 are continuously formed.

The through hole 49 shown in FIG. 31 includes the two curved surfaces 4951 and 4952. Specifically, the respective curved shapes of the two curved surfaces 4951 and 4952 are each formed so as to expand outside the through hole 49 in the width direction and to have a convex shape. The two curved surfaces 4951 and 4952 are made by respective sets of points radially spreading from predetermined reference points 4991 and predetermined reference points 4992 in the through hole 49 (see FIG. 41). The two curved surfaces 4951 and 4952 are respective curved surfaces (spherical surfaces) of the spheres having the respective reference points 4991 and 4992 as the centers (center points). Also, normals of the spherical surfaces having the respective reference points 4991 and 4992 (see FIG. 41) as the centers are disposed, respectively, on surfaces B1 and B2 (virtual surfaces indicated by the two-dot chain lines in FIG. 31). Here, there are, respectively, a plurality of predetermined reference points 4991 and a plurality of predetermined reference points 4992, and the plurality of reference points 4991 and the plurality of reference points 4992 are respectively disposed on the surfaces B1 and B2. Thus, on the surfaces B1 and B2, the reference points 4991 and 4992 are each arranged in a circular line manner (not shown, an endless perfect circular line in plan view). The surface directions of the surfaces B1 and B2 are the same as that of both main surfaces 42 and 43 of the base 4. Referring to the cross-sectional view of the base 4 in FIG. 31, the surfaces B1 and B2 are parallel to both main surfaces 42 and 43 of the base 4. Furthermore, the surface B2 is located nearer the other main surface 43 than the one main surface 42 of the base 4, and the surface B1 is located nearer the one main surface 42 than the other main surface 43 of the base 4.

Also, as described above, the two curved surfaces 4951 and 4952 each have the plurality of reference points 4991 and the plurality of reference points 4992 (see FIG. 41) as the centers, and the normals having respectively the reference points 4991 and 4992 as the centers are disposed on the surfaces B1 and B2. Furthermore, the two curved surfaces 4951 and 4952 have the same size. The diameters of the through hole 49 along the surfaces B1 and B2 have the largest width. In this embodiment indicated in FIG. 31, the diameter of the through hole 49 has the largest width when it is along the surfaces B1 and B2. However, it is not limited thereto. The open ends of the through hole 49 (one open end 492, the other open end 493) may have the same diameter as the diameter along the surfaces B1 and B2, that is, the opening ends of the through hole 49 may also have the largest width.

Furthermore, the inner side surface 491 of the through hole 49 includes three projections 498 that project into the hole. Projection end edges 4981 of the projections 498 are end edges of the curved surfaces 4951 and 4952. The three projections 498 according to this embodiment respectively have the circular shapes. The inner side surface 491 of the through hole 49 constituted by portions among the three projections 498 is formed by the curved surfaces 4951 and 4952. In this embodiment, the three projections 498 are formed, but the present invention is not limited thereto. More projections may be formed.

Next, a method for producing the through hole 49 of the base 4 shown in FIG. 31 will be described with reference to FIGS. 31 to 43.

Figure 32:
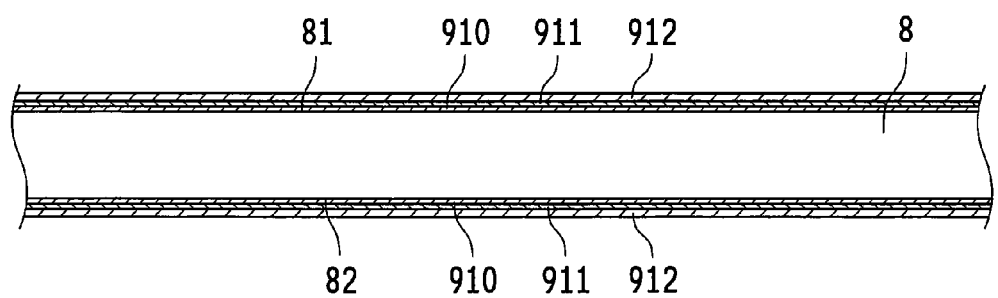
FIG. 32 is a schematic partial cross-sectional view of a wafer in a step of a production process of a base according to another embodiment of the present invention.

A single plate wafer 8 made of a glass material (isotropic material) is used for forming a number of bases 4. As shown in FIG. 32, a Cr film 910 made of Cr is formed by sputtering on both main surfaces 81 and 82 of the wafer 8. On the Cr film 910, a Au film 911 made of Au is formed by sputtering.

On the Au film 911, a resist is applied by spin coating to form a positive resist layer 912.

After forming the positive resist layer 912, exposure and development by photolithography are carried out with respect to the positive resist layers 912 of the one main surface 81 of the wafer 8 so as to form part of the cavity 45 except the pedestal portion 46. Then, the exposed Cr film 910 and Au film 911 are metal etched to form a prescribed pattern (part of the cavity 45 except the pedestal portion 46), as shown in FIG. 33.

Figure 33:
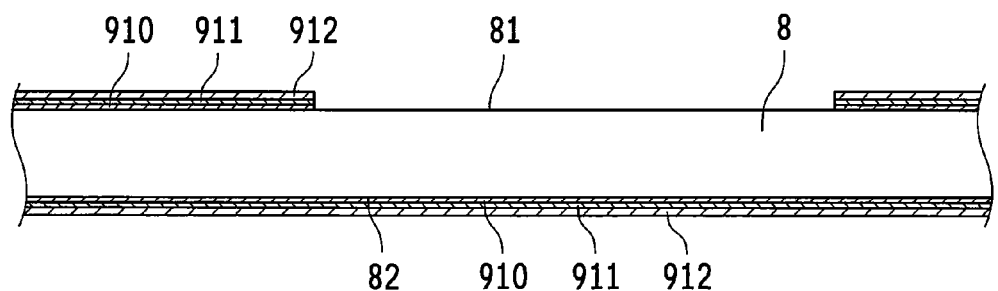
FIG. 33 is a schematic partial cross-sectional view of the wafer in a step of the production process of the base according to another embodiment of the present invention.

After the prescribed pattern has been formed as shown in FIG. 33, the wafer 8 is wet etched using photolithography. Thus, as shown in FIG. 34, a number of bases 4 are formed with respect to the wafer 8, and each base 4 includes part of the cavity 45 except the pedestal portion 46.

Figure 34:
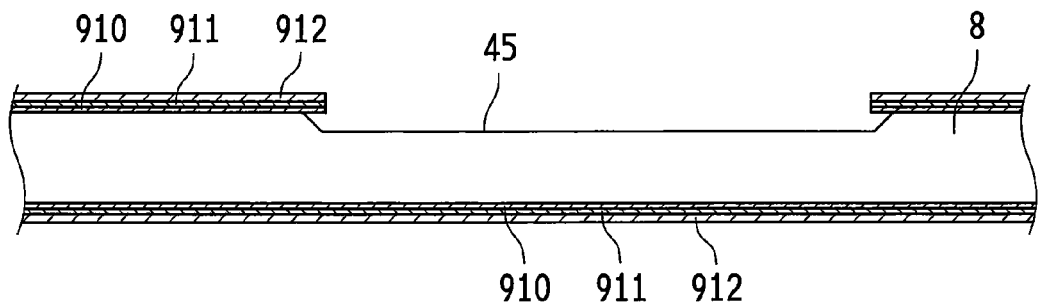
FIG. 34 is a schematic partial cross-sectional view of the wafer in a step of the production process of the base according to another embodiment of the present invention.

As shown in FIG. 34, with respect to the wafer 8 having a number of the bases 4 each including part of the cavity 45, the positive resist layer 912, the Cr film 910 and the Au film 911 are delaminated and removed to make the blank wafer 8.

A Cr film 910 made of Cr is formed by sputtering on both main surfaces 81 and 82 of the blank wafer 8. On the Cr film 910, a Au film 911 made of Au is formed by sputtering. On the Au film 911, a resist is applied by dip coating, thus a positive resist layer 912 is formed.

After forming the positive resist layer 912, in order to form the cavity 45 including the pedestal portion 46, exposure and development by photolithography are carried out with respect to the positive resist layer 912 of the one main surface 81 of the wafer 8. Then, the exposed Cr film 910 and Au film 911 are metal etched to form a prescribed pattern (the cavity 45 including the pedestal portion 46 and the outer periphery edge of the other main surface 43 of the base 4), as shown in FIG. 35.

Figure 35:
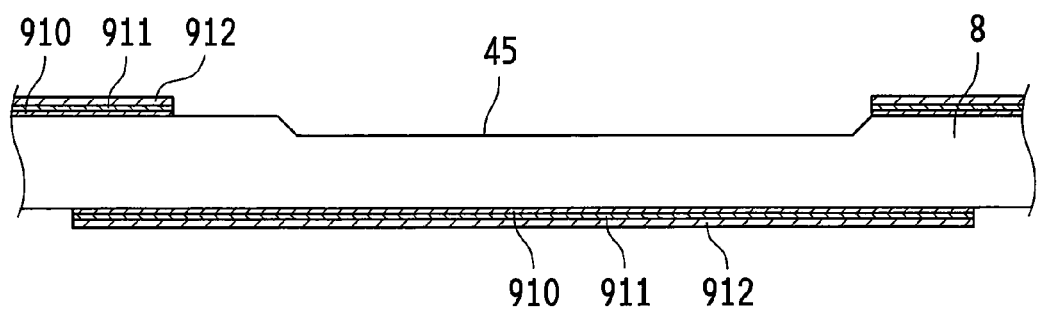
FIG. 35 is a schematic partial cross-sectional view of the wafer in a step of the production process of the base according to another embodiment of the present invention.
Figure 36:
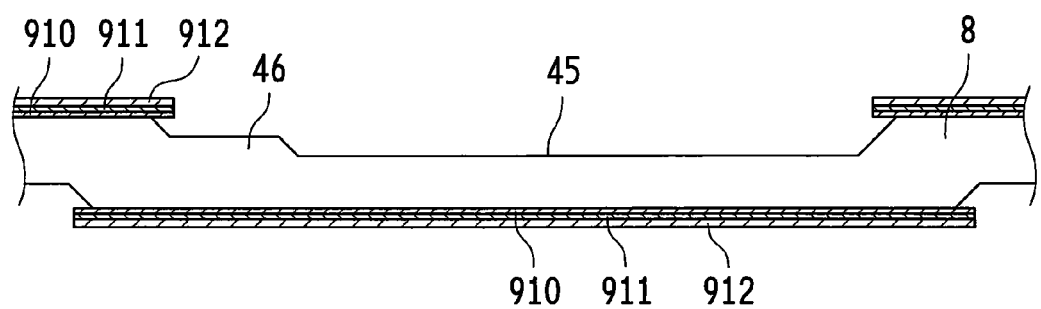
FIG. 36 is a schematic partial cross-sectional view of the wafer in a step of the production process of the base according to another embodiment of the present invention.

After the prescribed pattern has been formed as shown in FIG. 35, the wafer 8 is wet etched using photolithography. As shown in FIG. 36, with respect to the wafer 8, a number of bases 4 are formed. Each base 4 includes the cavity 45 including the pedestal portion 46, and the outer periphery edge of the other main surface 43 of the base 4.

Figure 37:
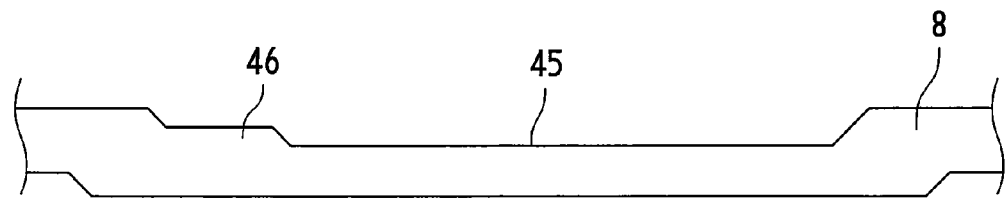
FIG. 37 is a schematic partial cross-sectional view of the wafer in a step of the production process of the base according to another embodiment of the present invention.

As shown in FIG. 36, with respect to the wafer 8 having a number of the bases 4 each including the cavity 45, the positive resist layer 912, the Cr film 910 and the Au film 911 are delaminated and removed to make the blank wafer 8 shown in FIG. 37.

A Cr film 910 made of Cr is formed by sputtering on both main surfaces 81 and 82 of the blank wafer 8. On the Cr film 910, a Au film 911 made of Au is formed by sputtering. On the Au film 911, a resist is applied by dip coating, thus a positive resist layer 912 is formed.

After forming the positive resist layer 912, in order to form the recess portions 496 (see FIG. 39) for making the flat surfaces 494 of the through holes 49, exposure and development by photolithography are carried out with respect to each of the positive resist layer 912 of both main surfaces 81 and 82 of the wafer 8. Then, the exposed Cr film 910 and Au film 911 are metal etched to form a prescribed pattern (the recess portions 496 for making the flat surfaces 494 of the through holes 49), as shown in FIG. 38.

Figure 38:
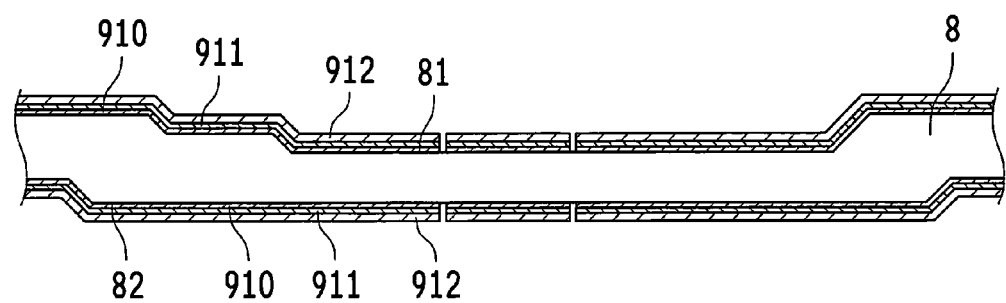
FIG. 38 is a schematic partial cross-sectional view of the wafer in a step of the production process of the base according to another embodiment of the present invention.
Figure 39:
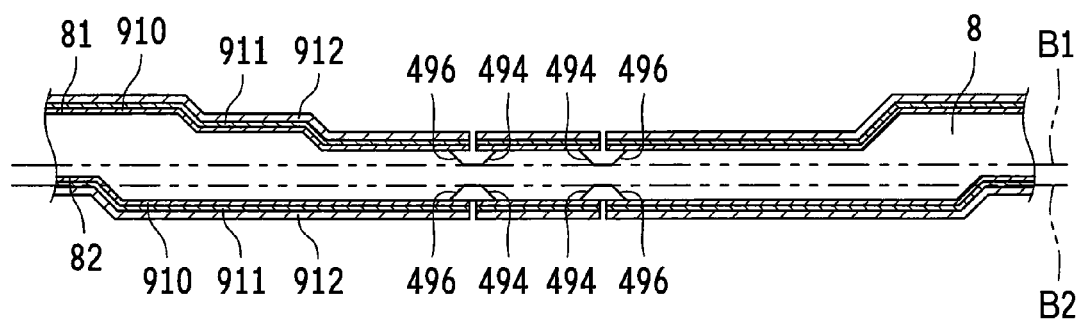
FIG. 39 is a schematic partial cross-sectional view of the wafer in a step of the production process of the base according to another embodiment of the present invention.

After the prescribed pattern has been formed as shown in FIG. 38, the wafer 8 is wet etched using photolithography. Thus, a number of bases 4 are formed with respect to the wafer 8, and each base 4 includes, on both main surfaces 81 and 82 (one main surface 81, the other main surface 82), the recess portions 496 for forming the flat surfaces 494 of the through holes 49, as shown in FIG. 39. Here, the bottom portions inside the recess portions 496 serve as reference surfaces for setting the surface B1 and B2 (virtual surfaces indicated by the two-dot chain lines in FIG. 39). Also, the inner side surfaces of the recess portions 496 are flat surfaces (flat surfaces 494), but are not limited thereto. Any tapered surfaces will be sufficient that are tapered relative to both main surfaces 81 and 82 of the wafer 8 (see both main surfaces 42 and 43 of the base 4). For this reason, the tapered surface may include, at least in part thereof, a curved surface expanding in the wet etching direction.

Figure 40:
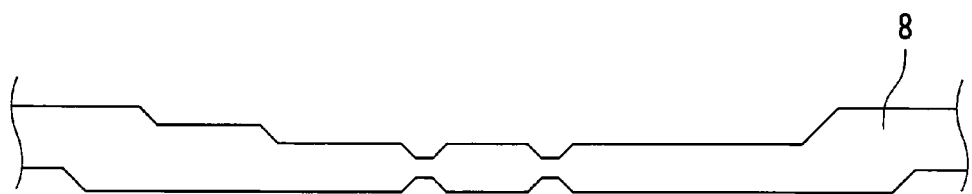
FIG. 40 is a schematic partial cross-sectional view of the wafer in a step of the production process of the base according to another embodiment of the present invention.

After forming, with respect to both main surfaces 81 and 82 of the wafer 8, the recess portions 496 for forming the flat surfaces 494 of the through holes 49, the positive resist layer 912, the Cr film 910 and the Au film 911 are delaminated and removed to make the blank wafer 8, as shown in FIG. 40. The steps up to here are part of a forming process of the present invention, and are called a first forming step.

In order to form, with respect to the wafer 8 as shown in FIG. 40, the through holes 49 (curved surfaces 4951 and 4952), a new Cr film 910 is formed by sputtering on both main surfaces 81 and 82 of the wafer 8. On the Cr film 910, a new Au film 911 is formed by sputtering. On the Au film 911, a resist is applied by electrodeposition coating (or spray coating), thus a new positive resist layer 912 is formed. In this embodiment, since electrodeposition coating (or spray coating) is used for forming the new positive resist layer 912, the new positive resist layer 912 can be formed on inner surfaces 497 (inner side surfaces and inner bottom surfaces) of the recess portions 496.

Figure 41:
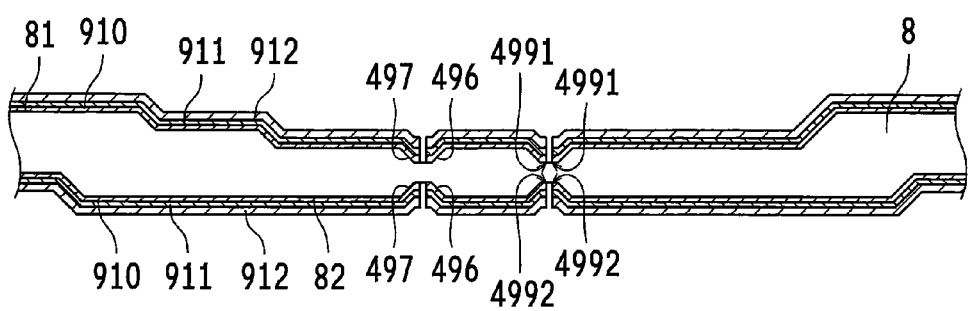
FIG. 41 is a schematic partial cross-sectional view of the wafer in a step of the production process of the base according to another embodiment of the present invention.

After forming the new positive resist layer 912, in order to form the curved surfaces 4951 and 4952 of the through holes 49, exposure and development by photolithography are carried out with respect to each of the positive resist layers 912 of the main surfaces 81 and 82 of the wafer 8. Then, the exposed Cr film 910 and Au film 911 are etched to form a pattern of the curved surfaces 495 of the through holes 49, as shown in FIG. 41. At this time, in the recess portion 496, the positive resist layer 912, the Cr film 910 and the Au film 911 are delaminated and removed from only the center portion of the inner bottom surface. Here, the positive resist layer 912 (including the Cr film 910 and the Au film 911) is formed on the bottom surface inside the recess portion 496. Exposed end edges of the center portions (see the points indicated by the reference numerals 4991 and 4992 in FIG. 41) exposed from the respective positive resist layers 912 are lines made by the multiple reference points 4991 and 4992 (endless perfect circular lines in plan view). Such exposed portions are opening patterns. The multiple reference points 4991 and 4992 are respectively on the surfaces B1 and B2 (virtual surfaces indicated by the two-dot chain lines in FIG. 39).

Figure 42:
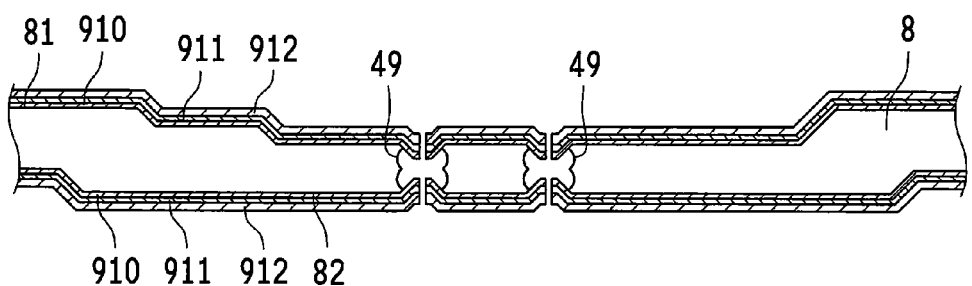
FIG. 42 is a schematic partial cross-sectional view of the wafer in a step of the production process of the base according to another embodiment of the present invention.

After the prescribed pattern has been formed as shown in FIG. 41, the wafer 8 is wet etched using photolithography. By the etching here, the wafer 8 is melted (etched) in a radial fashion from the plurality of references points 4991 and 4992, since in this embodiment, an isotropic material is used for the wafer 8. With respect to the wafer 8, a number of bases 4 are formed. As shown in FIG. 42, each base 4 includes the through holes 49.

Figure 43:
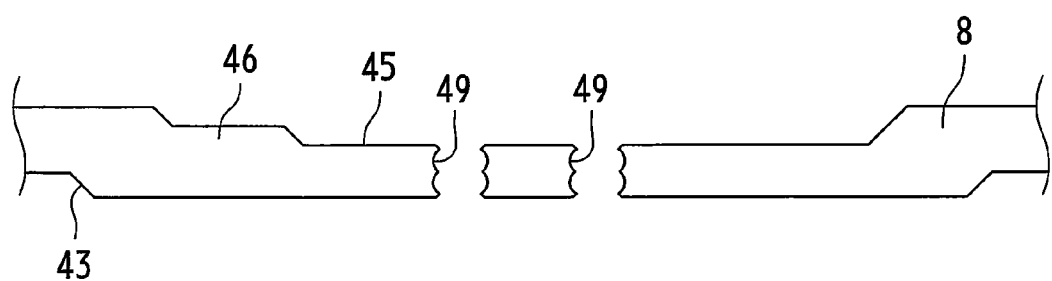
FIG. 43 is a schematic partial cross-sectional view of the wafer in a step of the production process of the base according to another embodiment of the present invention.

After forming the cavity 45, the through holes 49 and the outer periphery edge of the other main surface 43 with respect to the wafer 8, the positive resist layer 912, the Cr film 910 and the Au film 911 are delaminated and removed, as shown in FIG. 43. Thus, the blank wafer 8 is made, with respect to which a plurality of base 4 is formed (see the through holes 49 of FIG. 31). The steps up to here are part of the forming process of the present invention, and are called a second forming step. In the second forming step, it is not considered, at the time of filing the application, to use physical etching (dry etching and the like) in order to form the curved surfaces 495 of the base 4 downsized from the crystal resonator 1 (base 4), in consideration of accuracy for forming the surfaces and costs to be incurred. Furthermore, the forming process consists of the first forming step and the second forming step.

With respect to the wafer 8 shown in FIG. 43, the wiring pattern 55 is formed by a similar steps as the above embodiment. Thus, a number of bases 4 are formed with respect to the wafer 8. Each base 4 includes the resin pattern 61 formed in the through holes 49 and on the other main surface 43 of the base 4. After forming a number of the bases 4 with respect to the wafer 8, such bases 4 are divided into individual bases 4 (base dividing step), thus producing a number of the bases 4. Then, the crystal resonator plate 2 is disposed on the base 4. The crystal resonator plate 2 is electrically and mechanically bonded to the base 4 via the conductive bump 13 by ultrasonic bonding of FCB, thus mounting and holding the crystal resonator plate 2 on the base 4. In another step, the bonding material 12 is layered on the second bonding layer 74 of the lid 7 shown in FIG. 6. Then the lid 7 is disposed on the base 4 on which the crystal resonator plate 2 is mounted and held. The first bonding layer 48 of the base 4 and the second bonding layer 74 of the lid 7 are electrically and mechanically bonded to one another via the bonding material 12 by ultrasonic bonding of FCB. Thus, the crystal resonator 1 is produced.

As described above, the through hole 49 shown in FIG. 31 has advantageous effects of the through hole 49 shown in FIG. 5. Furthermore, with the through hole 49 shown in FIG. 31, each width of both open ends (one open end 492, the other open end 493) can be made narrower than that of the through hole 49 shown in FIG. 5.

It will be readily appreciated that the above-described embodiment and modifications may be combined in any suitable manner.

The present invention can be embodied and practiced in other different forms without departing from the spirit and essential characteristics of the present invention. Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

This application claims priority based on Patent Application No. 2011-216965 filed in Japan on Sep. 30, 2011. The entire contents thereof are hereby incorporated in this application by reference.

INDUSTRIAL APPLICABILITY

The present invention is applicable to an electronic component package on which an electronic component element is mounted.

DESCRIPTION OF REFERENCE NUMERALS

1 Crystal resonator
11 Inner space
12 Bonding material
13 Conductive bump
2 Crystal resonator plate (electronic component element)
20 Piezoelectric resonator blank
21, 22 Leg portion
211, 221 Distal end portion
23 Base portion
231 One end surface
232 The other end surface
233 Side surface
24 Bonding portion
241 Shorter side portion
242 Longer side portion
243 Distal end portion
25 Groove portion
26 Through hole
27 Bonding point
31, 32 Excitation electrode
33, 34 Extraction electrode
4 Base (electronic component package sealing member as a sealing member)
41 Bottom portion
42 One main surface
43 The other main surface
44 Wall portion
45 Cavity
452 One end portion
46 Pedestal portion
48 First bonding layer
49 Through hole
491 Inner side surface
492 One open end
493 The other open end
494 Flat surface
4941 First flat surface
4942 Second flat surface
495, 4951, 4952 Curved surface
496 Recess portion
497 Inner surface
498 Projection
4981 Projection end edge
499, 4991, 4992 Reference point
51, 52 Electrode pad
53, 54 External terminal electrode
541 Cut-out portion
55 Wiring pattern
58, 59 Contact area
61 Resin pattern, resin material, resin layer
7 Lid
71 Top portion
72 One main surface
73 Wall portion
731 Inner side surface
732 Outer side surface
733 Top surface
74 Second bonding layer
8 Wafer
81, 82 Main surface
83 Opening pattern
91 First seed film (first metal layer)
92 Second seed film (second metal layer)
93 First sputtered film (first sputtered layer)
94 Second sputtered film (second sputtered layer)
95 First plated film (first plated layer)
96 Second plated film (second plated layer)
97 Third plated film (third plated layer)
98 Fourth plated film (fourth plated layer)
910 Cr film
911 Au film
912 Positive resist layer
B, B1, B2 Surface

The invention claimed is:

1. An electronic component package sealing member that can be used as a sealing member of an electronic component package in which a plurality of the sealing members hermetically encloses an electrode of an electronic component element, comprising: a through hole passing through between both main surfaces of a base material that constitutes the electronic component package sealing member, the through hole having a maximum width and openings in the both main surfaces, wherein the through hole maximum width is greater than at least one of the openings in the main surfaces, and wherein an inner side surface of the through hole includes a curved surface that expands outward in a width direction of the through hole.

2. The electronic component package sealing member according to claim 1, wherein a plurality of the curved surface is formed.

3. The electronic component package sealing member according to claim 1, wherein the inner side surface of the through hole is constituted by the curved surface only.

4. The electronic component package sealing member according to claim 1, wherein the inner side surface of the through hole includes a tapered flat surface, wherein the curved surface is formed continuously from one main surface of the base material, wherein the tapered flat surface is formed continuously from the other main surface of the base material, and wherein the curved surface is formed continuously from the flat surface.

5. The electronic component package sealing member according to claim 1, wherein the inner side surface of the through hole includes a tapered first flat surface and a tapered second flat surface, wherein the tapered first flat surface is formed continuously from one main surface of the base material, wherein the curved surface is formed continuously from the first flat surface, wherein the tapered second flat surface is formed continuously from the other main surface of the base material, and wherein the curved surface is formed continuously from the second flat surface.

6. An electronic component package in which a plurality of sealing members hermetically encloses an electrode of an electronic component element, wherein at least one of the sealing members is the electronic component package sealing member according to claim 1.

7. An electronic component package sealing member that can be used as a sealing member of an electronic component package in which a plurality of the sealing members hermetically encloses an electrode of an electronic component element, comprising: a through hole passing through between both main surfaces of a base material that constitutes the electronic component package sealing member, the through hole having a maximum width and openings in the both main surfaces, wherein the through hole maximum width is greater than at least one of the openings in the main surfaces, and wherein an inner side surface of the through hole includes a curved surface constituted by a set of points radially spreading from a plurality of predetermined reference points in the through hole, and wherein the plurality of reference points are disposed on one surface.

8. The electronic component package sealing member according to claim 7, wherein a plurality of the curved surface is formed.

9. The electronic component package sealing member according to claim 7, wherein the inner side surface of the through hole is constituted by the curved surface only.

10. The electronic component package sealing member according to claim 7, wherein the inner side surface of the through hole includes a tapered flat surface, wherein the curved surface is formed continuously from one main surface of the base material, wherein the tapered flat surface is formed continuously from the other main surface of the base material, and wherein the curved surface is formed continuously from the flat surface.

11. The electronic component package sealing member according to claim 7, wherein the inner side surface of the through hole includes a tapered first flat surface and a tapered second flat surface, wherein the tapered first flat surface is formed continuously from one main surface of the base material, wherein the curved surface is formed continuously from the first flat surface, wherein the tapered second flat surface is formed continuously from the other main surface of the base material, and wherein the curved surface is formed continuously from the second flat surface.

12. An electronic component package in which a plurality of sealing members hermetically encloses an electrode of an electronic component element, wherein at least one of the sealing members is the electronic component package sealing member according to claim 7.

13. An electronic component package sealing member that can be used as a sealing member of an electronic component package in which a plurality of the sealing members hermetically encloses an electrode of an electronic component element, comprising: a through hole passing through between both main surfaces of a base material that constitutes the electronic component package sealing member,
  wherein an inner side surface of the through hole includes a curved surface that expands outward in a width direction of the though hole
  wherein a plurality of projections are formed on the inner side surface of the through hole so as to project into the through hole, and
  wherein a projection end edge of the projection is an end edge of the curved surface.

14. The electronic component package sealing member according to claim 13, wherein the inner side surface of the through hole between the plurality of projections is constituted by the curved surface.

15. An electronic component package sealing member that can be used as a sealing member of an electronic component package in which a plurality of the sealing members hermetically encloses an electrode of an electronic component element, comprising: a through hole passing through between both main surfaces of a base material that constitutes the electronic component package sealing member,
  wherein an inner side surface of the through hole includes a curved surface constituted by a set of points radially spreading from a plurality of predetermined reference points in the through hole,
  wherein the plurality of reference points are disposed on one surface
  wherein a plurality of projections are formed on the inner side surface of the through hole so as to project into the through hole, and
  wherein a projection end edge of the projection is an end edge of the curved surface.

16. The electronic component package sealing member according to claim 15, wherein the inner side surface of the through hole between the plurality of projections is constituted by the curved surface.

* * * * *